United States Patent [19]

Nakagawa et al.

[11] Patent Number: 4,926,229
[45] Date of Patent: May 15, 1990

[54] PIN JUNCTION PHOTOVOLTAIC ELEMENT WITH P OR N-TYPE SEMICONDUCTOR LAYER COMPRISING NON-SINGLE CRYSTAL MATERIAL CONTAINING ZN, SE, H IN AN AMOUNT OF 1 TO 4 ATOMIC % AND A DOPANT AND I-TYPE SEMICONDUCTOR LAYER COMPRISING NON-SINGLE CRYSTAL SI(H,F) MATERIAL

[75] Inventors: Katsumi Nakagawa, Nagahama; Shunichi Ishihara, Hikone; Masahiro Kanai, Tokyo; Kozo Arao, Hikone; Yasushi Fujioka; Akira Sakai, both of Nagahama, all of Japan

[73] Assignee: Canon Kabushiki Kaisha, Tokyo, Japan

[21] Appl. No.: 272,926

[22] Filed: Nov. 18, 1988

[30] Foreign Application Priority Data

Nov. 20, 1987 [JP] Japan .................. 62-291685

[51] Int. Cl.$^5$ ............................ H01L 45/00
[52] U.S. Cl. ............................ 357/30; 357/2; 357/11; 357/58; 357/59; 357/61
[58] Field of Search ................ 357/30 E, 11, 2, 30 B, 357/30 H, 30 J, 30 R, 58, 59, 61

[56] References Cited

U.S. PATENT DOCUMENTS 4,292,461  9/1981  Hovel .................. 136/249
4,433,202  2/1984  Maruyama .............. 136/255

FOREIGN PATENT DOCUMENTS 61-120480  6/1986  Japan .

OTHER PUBLICATIONS

Bleicher, "Group II–VI Compounds in Optoelectronics" Funk-Technik, vol. 31, No. 20, pp. 644–645, 648, 649, 652, Oct. 1976.

Primary Examiner—Andrew J. James
Assistant Examiner—David Soltz
Attorney, Agent, or Firm—Fitzpatrick, Cella, Harper & Scinto

[57] ABSTRACT

An improved pin junction photovoltaic element which causes photoelectromotive force by the junction of a p-type semiconductor layer, an i-type semiconductor layer and an n-type semiconductor layer, characterized in that at least one of said p-type semiconductor layer and said n-type semiconductor layer comprises a p-typed or n-typed ZnSe:H:M film, where M is a dopant of p-type or n-type: the amount of the H is in the range of from 1 to 4 atomic %: and said film contains crystal grain domains in a proportion of 65 to 85 vol % per unit volume; and said i-type semiconductor layer comprises a non-single crystal Si(H,F) film or a non-single crystal Si(C,Ge)(H,F) film.

10 Claims, 11 Drawing Sheets

PIN JUNCTION PHOTOVOLTAIC ELEMENT WITH P OR N-TYPE SEMICONDUCTOR LAYER COMPRISING NON-SINGLE CRYSTAL MATERIAL CONTAINING ZN, SE, H IN AN AMOUNT OF 1 TO 4 ATOMIC % AND A DOPANT AND I-TYPE SEMICONDUCTOR LAYER COMPRISING NON-SINGLE CRYSTAL SI(H,F) MATERIAL

FIELD OF THE INVENTION

The present invention relates to an improved photovoltaic element which is usable as a power source for electric appliances and also as a power generator. More particularly, it relates to an improved pin junction photovoltaic element with a p-type or n-type semiconductor layer comprising a non-single crystal material containing zinc atoms, selenium atoms, hydrogen atoms in an amount of 1 to 40 atomic % and a dopant and an i-type semiconductor layer comprising a non-single crystal Si(H,F) material which exhibits a high photoelectric conversion efficiency, particularly for short-wavelength light.

BACKGROUND OF THE INVENTION

There have been proposed a variety of pin junction photovoltaic elements for solar cells and for power sources in various electric appliances. Such photovoltaic elements are formed by ion implantation or thermal diffusion of an impurity into a single crystal substrate of silicon (Si) or gallium arsenide (GaAs), or by epitaxial growth of an impurity-doped layer on said single crystal substrate. However, there is a disadvantage for these photovoltaic elements that their production cost unavoidably becomes high because of using said specific single crystal substrate. Because of this, they have not yet gained general acceptance for use as solar cells or as power sources in electric appliances.

Recently, there has been proposed a photovoltaic element in which there is utilized a pin junction of amorphous silicon (hereinafter referred to as "A-Si") deposited film formed on an inexpensive non-single crystal substrate of glass, metal, ceramic or synthetic resin by way of glow discharge decomposition method. This photovoltaic element has a nearly satisfactory performance and is of low production cost and because of this, it has been recognized usable as a power source for some kinds of appliances such as electronic calculators and wrist watches.

However, for this photovoltaic element, there is a disadvantage that the output voltage is low because the band gap of the A-Si film constituting the element is about 1.7 eV, which is not large enough. There is another disadvantage that its photoelectric conversion efficiency is low for a light source such as fluorescent light which contains short-wavelength light in a dominant proportion, so that its application is limited to appliances with very small power consumption.

There is a further disadvantage for said photovoltaic element that the constituent A-Si film is often accompanied with a character of the so-called Staebler-Wronsk effect, with which the film being deteriorated upon continuous irradiation with intense light for a long period of time.

For a photovoltaic element to be immobilized as a power solar cell, it is necessary to convert efficiently and continuously the light energy of sunlight into the electric energy, and hence, it is desired to have such a layer structure that permits photoelectric conversion for sunlight over as broad a spectrum range as possible.

Now, in the case of a photovoltaic element which is made using a semiconductor material having a small energy band gap, the wavelength region of light to be absorbed by the layer is extended from the short wavelength side to the long wavelength side. However, in this case, it is the long-wavelength component of sunlight alone that contributes to photoelectric conversion, and the energy of the short-wavelength component is not served for photoelectric conversion. This is because the amount of energy to be outputted by the photoelectric conversion is decided upon the energy band gap of the semiconductor material as used.

On the other hand, in the case of a photovoltaic element which is made using a semiconductor material having a large energy band gap, the wavelength component which is absorbed by the layer and comes to contribute to photoelectric conversion is the short wavelength light having an energy exceeding the energy band gap of the semiconductor material as used, and the long-wavelength component is not served for photoelectric conversion.

By the way, in a photovoltaic element, the maximum voltage or open-circuit voltage (Voc) to be outputted is determined upon the energy band gap values of the semiconductor materials to be joined together. In view of this, in order to obtain a high Voc, semiconductor materials having a great energy band gap are desired to be used.

Therefore, there is eventually a limit for the photoelectric conversion efficiency for a photovoltaic element, which is prepared by using the sole semiconductor material.

The foregoing led to an idea of forming a plurality of photovoltaic elements using a plurality of semiconductor materials each having a different energy band gap, so that the individual photovoltaic elements become responsible for the different wavelength regions of sunlight. This idea was expected to contribute to an improvement in the photoelectric conversion efficiency.

However, there is a disadvantage for the solar cell having such layer structure as mentioned above that the high photoelectric conversion as a whole is possible only in the case where the individual photovoltaic elements have good characteristics, because it is of such structure that a plurality of photovoltaic elements are stacked to form an electrically serial structure.

Unfortunately, for the photovoltaic element having the foregoing structure, there has not yet realized any desirable one that the respective constituent elements as stacked have satisfactory values of energy band gap and satisfactory characteristics as desired and that provides a high Voc as the photovoltaic element.

Besides, there have been proposed direct transition-type semiconductor films having a wide band gap, such as ZnSe (having a band gap of 2.67 eV) and ZnTe (having a band gap of 2.26 eV) and mixed crystal thereof $ZnSe_{1-x}Te_x$ (where $0<x<1$). And the public attention has been focused on these semiconductor films. These semiconductor films are, in general, such that are formed on a single crystal substrate by way of epitaxial growth. The as-grown film of ZnSe exhibits n-type conductivity and the as-grown film of ZnTe exhibits p-type conductivity. However for any of these films, it is generally recognized that it is difficult for the film to be controlled to the opposite conductivity. Further, in order to carry out the epitaxial growth upon the film formation, it is required to use a specific single crystal substrate and to maintain the substrate at elevated temperature. And in this film formation, the deposition rate is low. Because of this, it is impossible to perform epitaxial growth on a commercially available substrate which is inexpensive and low heat-resistant such as glass and synthetic resin. These factors make it difficult to develop practically applicable semiconductor films using the foregoing commercially available substrates.

Even in the case where a semiconductor film should be fortunately formed on such commercially available substrate, the film will be such that is usable only in very limited applications.

There have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film becomes to be accompanied with defects of various kinds which make the film poor in electrical characteristics and on account of this, it is difficult for the film to be controlled by doping it with an impurity.

In the meantime, amorphous film comprised of Zn and Se elements can be found in prior art references. As such prior art references, there are U.S. Pat. No. 4,217,374 (hereinafter, called "literature 1") and U.S. Pat. No. 4,226,898 (hereinafter, called "literature 2"). And ZnSe compound is described in Japanese Patent Laid-open No. 189649/1986 (hereinafter, called "literature 3") and Japanese Patent Laid-open No. 189650/1986 (hereinafter, called "literature 4").

Now, literature 1 discloses amorphous semiconductor films containing selenium (Se) or tellurium (Te), and zinc (Zn), hydrogen (H) and lithium (Li); but the subject lies in amorphous selenium semiconductor film or in amorphous tellurium semiconductor film, and the Zn described therein is merely an additive as well as Li and H. And as for the Zn and the Li, likewise in the case of the H, they are used aiming at reduction of the local state density in the energy band gap without changing the inherent characteristics of the film. In other words, the incorporation of Zn into the amorphous Se or the amorphous Te in literature 1 is not intended to positively form a ZnSe compound or a ZnTe compound. Incidentally, literature 1 mentions nothing about the formation of a ZnSe compound, ZnTe crystal grains or $ZnSe_{1-x}Te_x$ crystal grains. And as for the addition of Li, it should be noted that it is not added as a dopant.

Literature 2 does mention amorphous semiconductor films containing Se or Te, and Zn, and H. However, it deals mainly with amorphous silicon, and it defines Se and Te as elements to form a compound with said silicon. As for the Zn, it defines as an element to sensitize the photoconductivity and reduce the local state density in the energy gap. In other words, the additions of Zn and Se are not intended to form a ZnSe compound, ZnTe compound or $ZnSe_{1-x}Te_x$ compound. Incidentally, literature 2 mentions nothing about the formation of a ZnSe compound, ZnTe compound, $ZnSe_{1-x}Te_x$ compound, ZnSe crystal grains, ZnTe crystal grains or $ZnSe_{1-x}Te_x$ crystal grains.

Literature 3 and literature 4 are concerned with the deposition of a ZnSe film by HR-CVD method (hydrogen radical assisted CVD method). That is, they disclose methods of improving the deposition rate and the productivity of a deposited film; and they merely mention deposited films of non-doped ZnSe.

Against these backgrounds, there is an increased social demand to provide an inexpensive photovoltaic element having a high photoelectric conversion efficiency, particularly, for short-wavelength light which may be practically usable as solar cell and also as a power source in various electric appliances.

SUMMARY OF THE INVENTION

The present invention is aimed at solving the aforementioned problems relating to photovoltaic elements for use in solar cells and other appliances and satisfying the foregoing social demands.

It is therefore an object of the present invention to provide an improved pin junction photovoltaic element usable in devices typified by solar cell with the use of an improved functional deposited film which may be desirably formed even on a commercially available inexpensive non-single crystal substrate of glass, metal, ceramic or synthetic resin and which may form a desired pin junction with other films to be formed on such substrate.

Another object of the present invention is to provide an improved pin junction photovoltaic element, which provides a high photoelectric conversion efficiency particularly for short-wavelength light and which is usable in devices typified by solar cell.

A further object of the present invention is to provide an improved pin junction photovoltaic element with a p-type or n-type semiconductor layer comprising a non-single crystal material containing zinc atoms, selenium atoms, hydrogen atoms in an amount of 1 to 4 atomic %, crystal grain domains in a proportion of 65 to 85 volume percent per unit volume, and a dopant of p-type or n-type and an i-type semiconductor layer comprising a silicon-containing non-single crystal film, which exhibits a high photoelectric conversion efficiency particularly for short-wavelength light and which is effectively usable particularly as solar cell.

DETAILED DESCRIPTION OF THE INVENTION

Figure 1A:
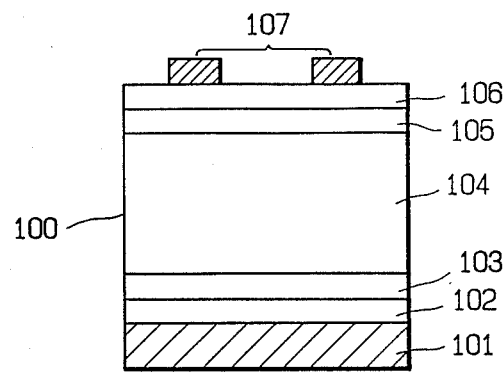
FIG. 1(A) is a schematic cross-sectional view of a typical pin junction photovoltaic element according to the present invention.

The present inventors have made extensive studies for overcoming the foregoing problems on the known ZnSe film for use in various appliances such as solar cell and attaining the objects as described above and as a result, have accomplished the present invention based on the findings as below described.

That is, as a result that there was prepared a ZnSe deposited film in which a specific amount of hydrogen atoms being incorporated and the proportion of crystal grains per unit volume being controlled to a specific value (this deposited film is hereinafter referred to as "ZnSe:H film"), the present inventor have found the facts that (a) said ZnSe:H film is a non-single crystal film which may be formed in a desired state even on a non-single crystal substrate of glass, metal, ceramics or synthetic resin: (b) said ZnSe:H film formed on such non-single crystal substrate is accompanied with very few defects: (c) it can be easily and efficiently doped with a dopant of p-type or n-type: and (d) when doped with a p-type dopant, it becomes a desirable p-type ZnSe:H semiconductor film having a wealth of many practically applicable semiconductor characteristics.

The present inventors have found further facts that in the case of using the foregoing ZnSe:H film as a member for pin junction in the preparation of a pin junction photovoltaic element, there is afforded a pin junction photovoltaic element which efficiently and stably generates a desired photoelectromotive force.

The present invention has been completed on the basis of these findings, and it provides pin junction photovoltaic elements as below mentioned;

(1) a pin junction photovoltaic element which comprises a p-type semiconductor layer, an i-type semiconductor layer and an n-type semiconductor layer being stacked, characterized in that at least said p-type semiconductor layer or said n-type semiconductor layer comprises a deposited film comprised of zinc atoms, selenium atoms and at least hydrogen atoms and which contains a dopant of p-type or n-type said deposited film contains said hydrogen atoms in an amount of 1 to 4 atomic %: and said deposited film contains crystal grain domains in a proportion of 65 to 85 vol % per unit volume; and said i-type semiconductor layer comprises (a) a non-single crystal film containing silicon atoms as the matrix and at least one kind selected from the group consisting of hydrogen atoms and fluorine atoms or (b) a non-single crystal film containing silicon atoms, at least one kind selected from the group consisting of carbon atoms and germanium atoms, and at least one kind selected from the group consisting of hydrogen atoms and fluorine atoms; (2) the pin junction photovoltaic element as defined in the above (1), wherein said p-type dopant is a member selected from the group consisting of Group IA elements and Group VA elements of the Periodic Table; and (3) the pin junction photovoltaic element as defined in the above (2), wherein said member is lithium.

The experiments carried out by the present inventors to obtain the foregoing findings will be detailed in the following.

Experiment A:

Observation on the proportion of crystal grain domains as formed in a ZnSe:H deposited film when hydrogen atoms are introduced thereinto (1) Preparation of samples (i) There were provided two kinds of substrates; (a) a p-type round silicon wafer of 0.5 mm in thickness and 1 inch in diameter (having an electrical resistivity ($\rho$) of about $10^{-1}$ $\Omega$-cm), on which is formed an $SiO_2$ film of about 5000 Å in thickness, by way of the known thermal oxidation treatment in an oxygen gas stream at 1000° C. and (b) a square quartz glass of 2.5 cm by 2.5 cm in size.

Figure 2:
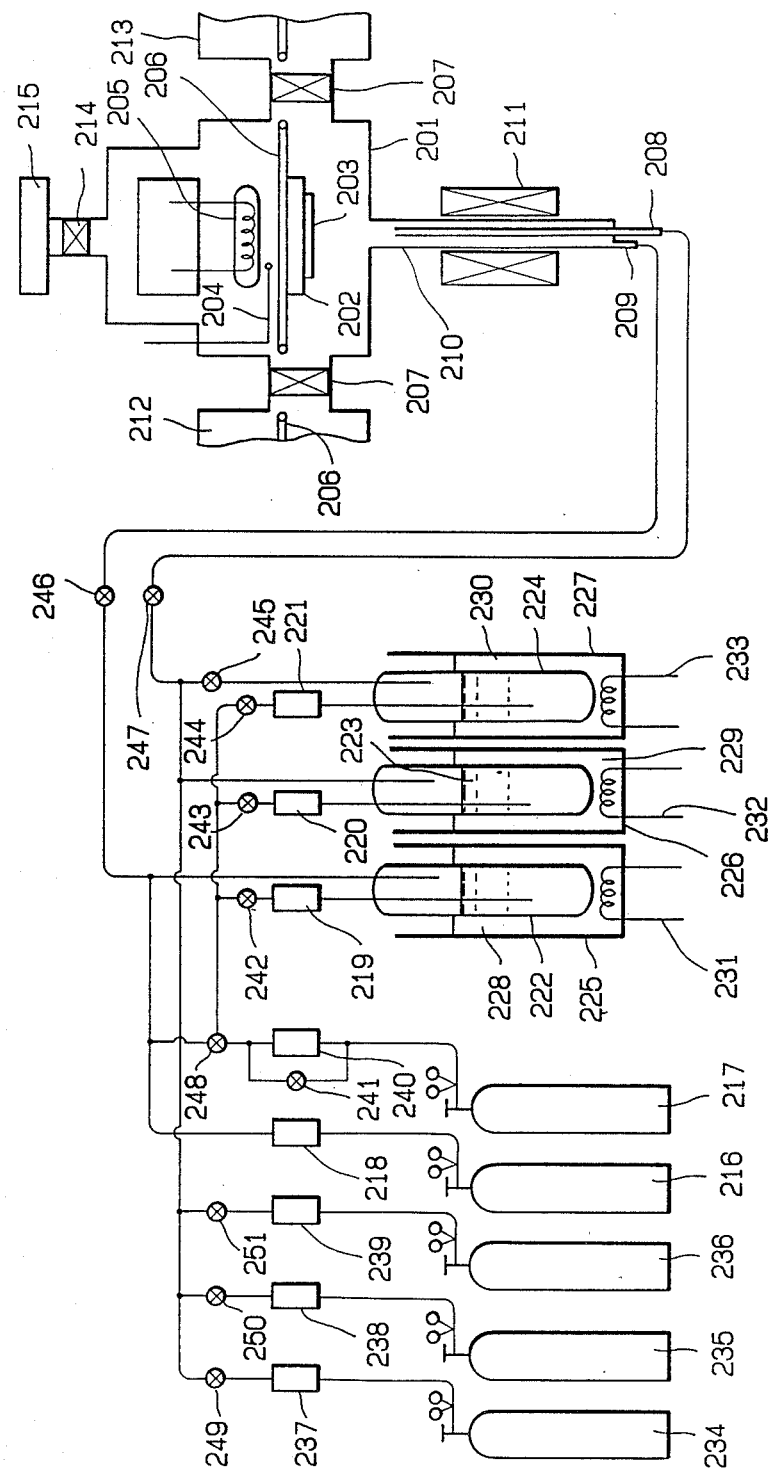
FIG. 2 is a schematic diagram to illustrate a representative apparatus suitable for practicing the later described process (1) of forming a constituent layer for any of the above photovoltaic elements according to the present invention.

(ii) The above-mentioned two substrates were placed side by side on the substrate holder 202 of the known apparatus as shown in FIG. 2. On every substrate was formed a ZnSe:H film under the conditions shown in Table 1. Thus, there were obtained samples Nos. 1–12 [on substrates (a)] and samples Nos. 1'–12' [on substrates (b)].

(iii) Each of samples Nos. 1–12 (deposited on silicon wafers) was cut in half. Each of the cut halves was cut to a 5 mm square size which matches the holder of the known transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite side of the glass plate.

(iv) The exposed part comprising silicon single crystal wafer of the sample as prepared in the above (iii) was etched with an aqueous solution containing HF, $HNO_3$, and $CH_3COOH$. The etching rate was properly controlled by changing the concentration of HF in the etching solution. Etching was continued until the silicon single crystal wafer was completely removed. In this case, the progress of the etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a ZnSe:H film thereon.

(2) Examination of the film specimens prepared in the above step (1)

Each film specimen of samples Nos. 1–12 formed on silicon wafers in the above step (1) was examined by fixing it to the sample holder of the TEM (acceleration voltage: 200 KeV) to form a transmission image and observing the resultant transmission image. As a result, it was found for the resultant transmission image that there is a lattice image with very few lattice defects in the part of the ZnSe:H film where crystal grain domains exist. It was also found that the lattice images are uniformly distributed throughout the ZnSe:H film.

The lattice image was utilized to determine the proportion of crystal grain domains in a certain area of the film specimen. Thus the proportion in terms of volume percentage (vol %) of the crystal grain domains present in the deposited film was calculated.

For the purpose of reference, the direction of the crystal grain and the size of the crystal grain domain were measured by the aid of X-ray diffraction.

(3) Determination of the amount of hydrogen atoms (H) in the deposited film (i) Each of samples Nos. 1'-12' deposited on quartz substrates in the above-mentioned step (1)-(i) was cut in half. Each of the cut halves was placed in a vacuum chamber and heated therein from room temperature to 1000° C. During the heating process, the amount of hydrogen atoms (H) released from the specimen was determined by means of a mass spectrometer. The resulting data were compared with those of the standard sample prepared by implanting a known amount of hydrogen atoms into a hydrogen-free sample.

(ii) Each deposited film of samples Nos. 1–12 used for the TEM observation was examined for the distribution of Zn atoms and Se atoms by the aid of a known X-ray microanalyzer (hereinafter referred to as "XMA", made by Shimazu Seisakusho Ltd.), and was also subjected to elemental analysis. The results obtained were as shown in Table 2.

The above analysis was carried out on the assumption that the matrix is comprised of Zn, Se; wherein hydrogen atoms (H), and others in the film were excluded from calculations.

The data obtained for all of samples Nos. 1–12 indicate that Zn atoms and Se atoms are uniformly distributed in the entire layer region of the deposited film and that the composition ratio of Zn atoms to Se atoms is stoichiometrically about 1:1.

(4) Results

Figure 5:
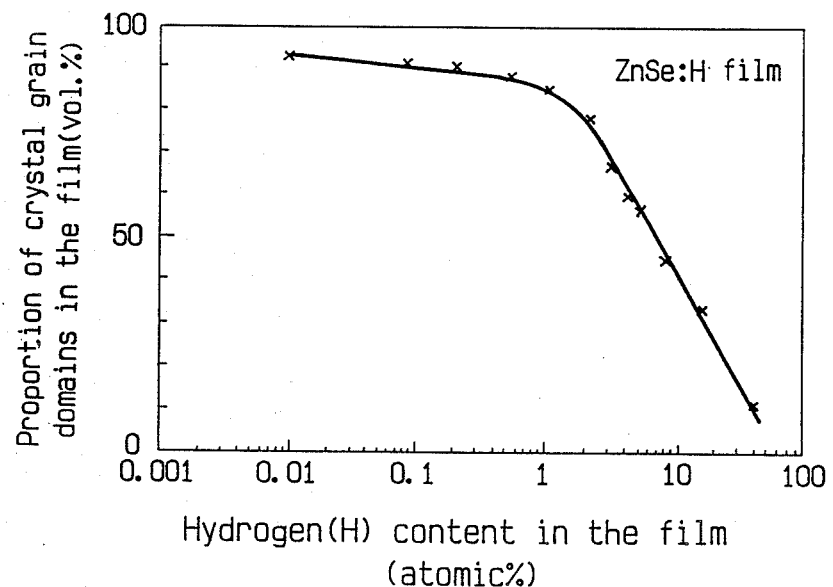
FIG. 5 is a graph showing the interrelation of measured results for the proportions of crystal grain domains and for the contents of hydrogen atoms (H) on ZnSe:H films deposited on silicon wafers and quartz substrates in which data are from the below-mentioned Experiments A(2) and A(3).

The results of the measurements in the above steps (2) and (3) were graphically showning in FIG. 5. It was found from the results shown in FIG. 5 that as the content (atomic %) of hydrogen atoms (H) in a ZnSe:H deposited film increases, the proportion of crystal grain domains per unit volume in the deposited film decreases. And with the content of hydrogen atoms in the range of 0.1 to 10 atomic%, the proportion of crystal grain domains per unit volume in the film ranges from 90 to 40 vol %.

In the sample preparation in the above step (1), when the flow rate of hydrogen gas was controlled to a value lower than 0.05 sccm, the resulting deposited film became such that is composed mainly of Zn; and with a flow rate in excess of 2 slm, no film was deposited.

Experiment B:

Observations on the interrelations among electrical characteristics, the content of hydrogen atoms and the proportion of crystal grain domains per unit volume for the deposited film.

The deposited film formed on the quartz substrate in the above A-(1)-(ii) was examined for dark conductivity. The examination was carried out using the remaining cut halves of samples Nos. 1'-12'. Prior to measurements, a comb-shaped aluminum electrode was formed on each specimen by vacuum deposition. The results obtained were as shown in FIG. 6.

Figure 6:
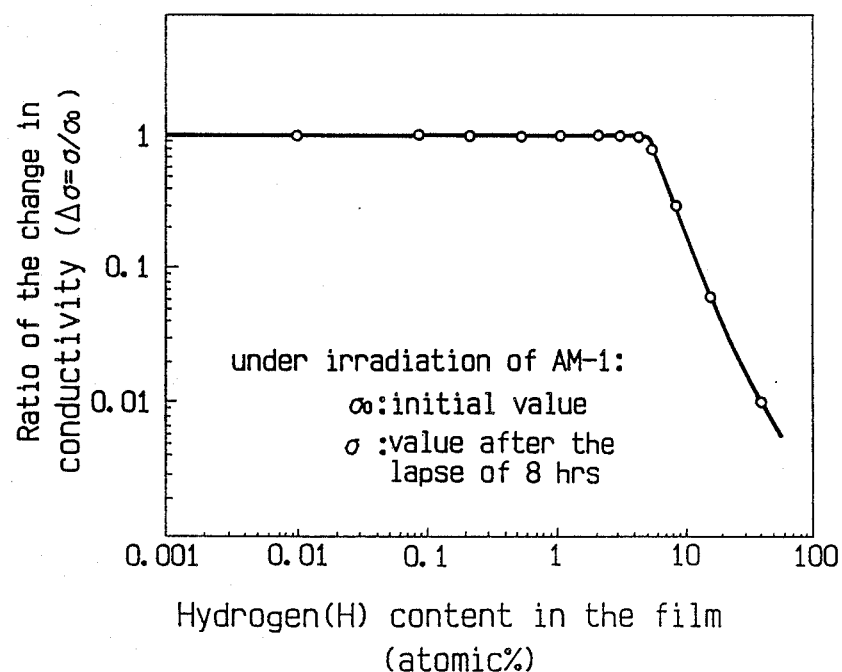
FIG. 6 is a graph showing the interrelations between the contents of hydrogen atoms (H) and the conductivities on deposited ZnSe:H films in the below-mentioned Experiment B.

From the results shown in FIG. 6, the following facts were found with respect to the ratio of the change in dark conductivity ($\sigma$) after irradiation with AM-1.5 for 8 hours versus the initial value ($\sigma o$), that is, $\Delta\sigma = \sigma/\sigma o$.

That is, it varies depending on the content of hydrogen atoms (H) in the film. With 4 atomic % or less, almost no change occurs, and with 8 atomic % and above, a significant change occurs.

Then, the interrelation between the content of hydrogen atoms and the drift mobility of holes for the deposited film was examined using the remaining cut halves of samples Nos. 1–12 prepared in the above step A-(1)-(ii). Prior to measurements, each specimen was provided with an aluminum semitransparent film by vacuum deposition. The specimen was irradiated with UV light pulses of about 1 nsec in a state that a pulse voltage was being applied across the aluminum film and the silicon wafer, with the aluminum film being negative. The drift mobility was measured by way of the known time-of-flight method. The results obtained were as shown in FIG. 7.

Figure 7:
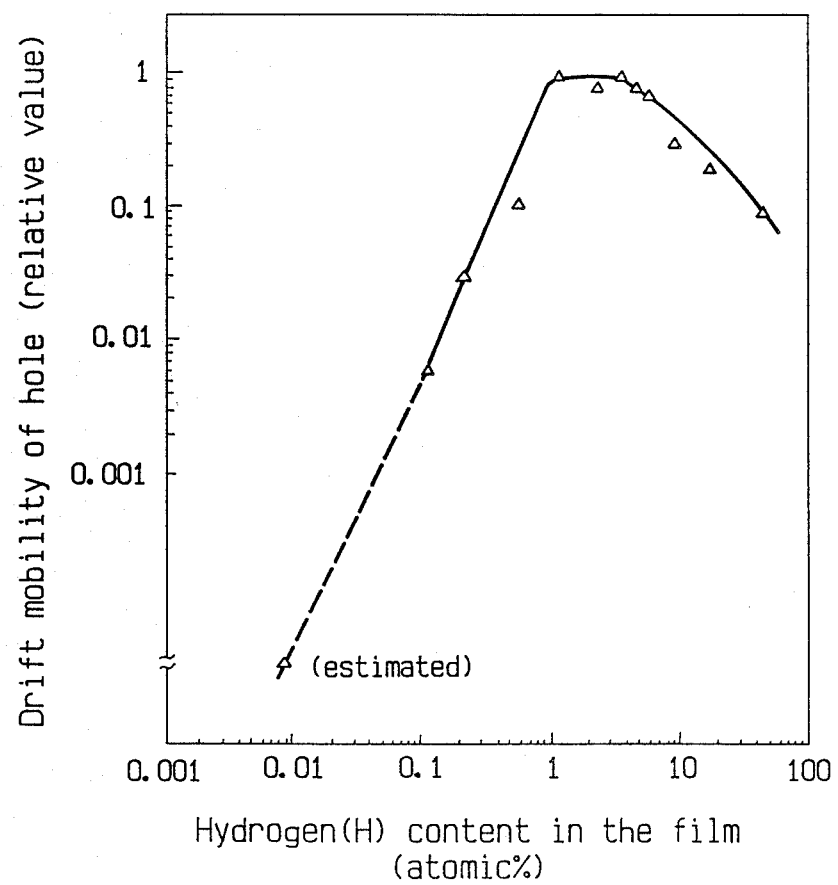
FIG. 7 is a graph showing the interrelations between the contents of hydrogen atoms (H) and the drift mobilities of hole on deposited ZnSe:H films in the below-mentioned Experiment B.

From the results shown in FIG. 7, the followings were found. That is, with a hydrogen content of less than 0.5 atomic %, the drift mobility of holes is very small. With a hydrogen content in the range from 1 to 8 atomic %, the drift mobility of holes is very high. And with a hydrogen content in excess of 8 atomic %, the drift mobility of holes gradually decreases.

These findings suggest that the content of hydrogen atoms in the deposited film should be 8 atomic % or less, preferably 4 atomic % or less, in the viewpoint of change in characteristics induced by the irradiation of light, and 0.5 atomic %, or more preferably, 1 atomic % or more, in the viewpoint of the mobility of holes.

As a result of studies on what above mentioned with due regards to what shown in FIG. 5, it was recognized that the proportion of the crystal grain domains per unit volume is in the range from 65 to 85 vol % for the ZnSe:H deposited film which contains 1 to 4 atomic % of hydrogen atoms.

It is concluded from the foregoing that the electrical characteristics of a ZnSe:H deposited film depend largely on the content of hydrogen atoms (H) and also on the proportion of crystal grain domains per unit volume in the film, and in order for the deposited film to be immobilized as having desired electrical characteristics suitable for use as solar cell or in other devices, it is necessary that the hydrogen content be in the range from 1 to 4 atomic % and the proportion of crystal grain domains per unit volume be in the range from 65 to 85 vol %.

Experiment C:

Observations on the interrelations among the doping properties, the content of hydrogen atoms and the proportion of crystal grain domains per unit volume for a ZnSe:H deposited film (1) The procedures of Experiment A were repeated, except that $LiC_3H_7$ ($1.0 \times 10^{-10}$ mol/min) was added to the raw material gas (A) in Table 1, to thereby form a ZnSe:H:Li film on a silicon wafer (with an SiO$_2$ film formed thereon) and also on a quartz glass substrate. Thus there were prepared samples Nos. 13–23 (on silicon wafer) and samples Nos. 13'–24' (on quartz glass).

(2) Each of samples Nos. 13'–24' (deposited on quartz glass substrates) was cut in half. The half was used for the measurement of dark conductivity after the formation of a comb-shaped aluminum electrode by vacuum deposition. The other half was used for the measurement of the content of hydrogen atoms (H) in the same manner as in Experiment A.

Figure 8:
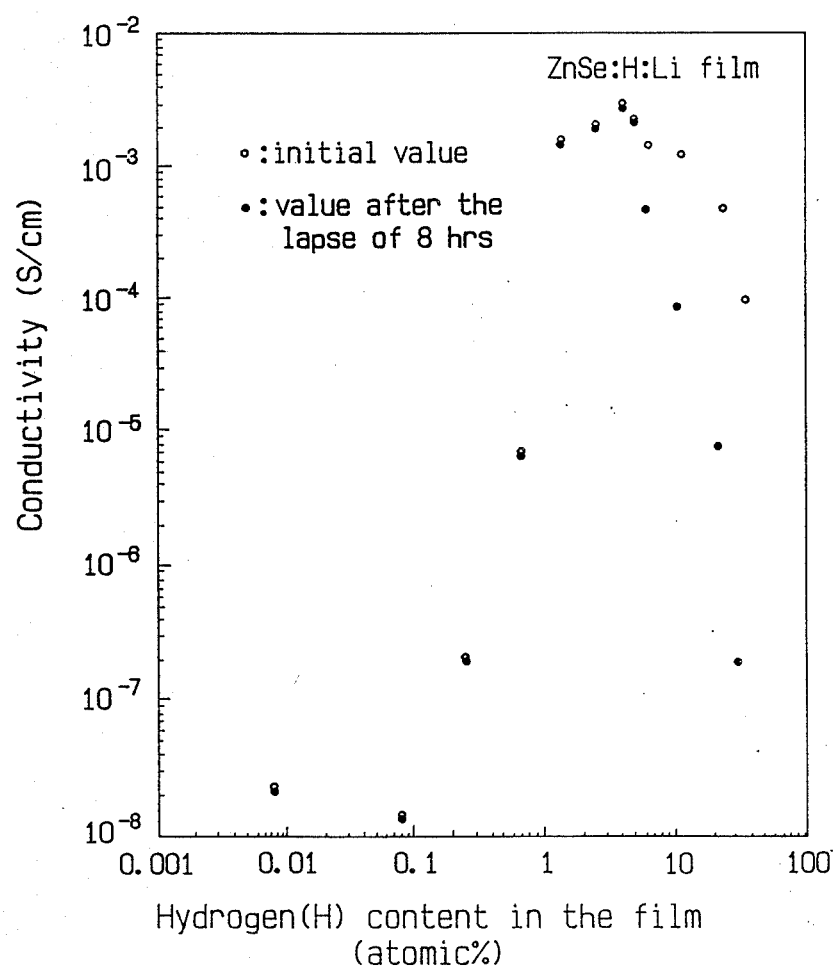
FIG. 8 is a graph showing the interrelations between the contents of hydrogen atoms (H) and the dark conductivities on deposited ZnSe:H:Li films in the below mentioned Experiment C.

The results of measurements were as shown in FIG. 8. In the figure, the black circle dot represents the dark conductivity of the ZnSe:H:Li film which was not irradiated with light more intense than room light. The white circle dot represents the dark conductivity of the ZnSe:H:Li film which was measured after continuous irradiation with AM-1.5 light (100 mW/cm$^2$) for 8 hours.

The specimens, with a comb-shaped aluminum electrode formed thereon by vacuum deposition, were examined for conduction type by the measurement of thermoelectromotive force. As a result, it was found that the specimens containing more than 0.25 atomic % of hydrogen atoms are of p-type conduction, and other specimens containing less than 0.08 atomic % of hydrogen atoms are of weak n-type conduction.

Figure 9:
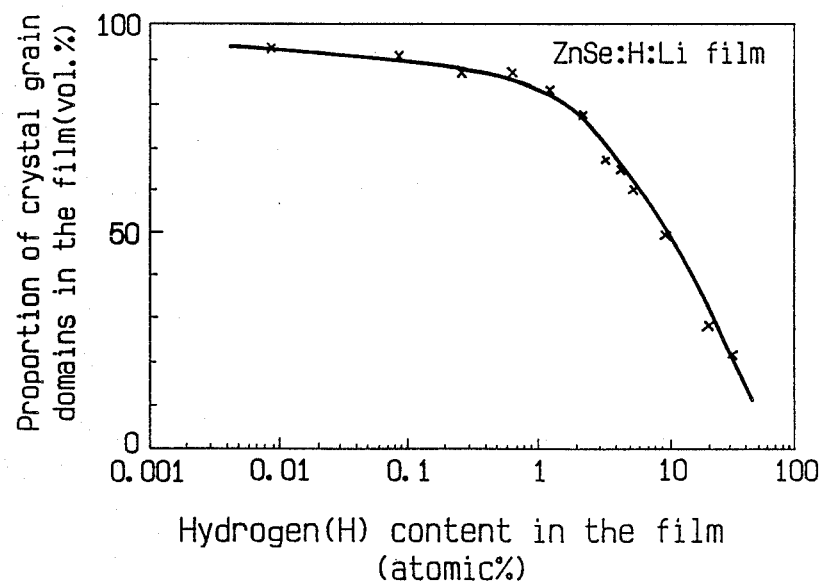
FIG. 9 is a graph showing the interrelations between the contents of hydrogen atoms (H) and the proportions of crystal grain domains on deposited ZnSe:H:Li films in the below-mentioned Experiment C.

(3) Samples Nos. 13–24 were examined for the proportion of crystal grain domains per unit volume in the same manner as in Experiment A. The results obtained were as shown in FIG. 9. And it was found that the interrelation between the proportion of crystal grain domains per unit volume and the content of hydrogen atoms (H) is almost identical with that of a non-doped film.

(4) From what shown in FIGS. 8 and 9, it is recognized that the film capable of being efficiently doped with a dopant contains more than 15 vol % of non-crystal grain domains per unit volume. In other words, for the film to be doped efficiently, it is necessary that the film be to contain more than 15 vol % of non-crystal grain domains per unit volume.

The foregoing suggests that the deposited film should contain a certain amount of non-crystal grains. With too small an amount of non-crystal grains, the resulting deposited film will be such that lacks in structural flexibility and is insufficient in structural relaxation at the crystal grain boundaries, and because of this, it is accompanied with defects such as dangling bonds. When such film is doped with a dopant, the dopant does not enter the crystal grains but agglomerates at the crystal grain boundaries. Even though the dopant should be incorporated into the film, the resulting film will be such that the valence electron and the dark conductivity can not be controlled as desired.

On the other hand, in the case of a film containing 15 vol % or more of non-crystal grains in the crystal grain boundaries or in the intercrystal space, with the dangling bonds terminated with hydrogen atoms (H), the structure is flexible and the defects at the crystal grain boundaries are few. Therefore, said film is by far superior in the displacement due to the addition of a dopant, that is the doping efficiency, to the deposited film which does not contain non-crystal grain domains. Incidentally, with non-crystal grain domans being less than 15 vol % per unit volume, the deposited film is apt to be easily peeled off from the substrate on account of its insufficient flexibility in structure.

The foregoing suggests that the deposited film should contain more than 15 vol % of non-crystal grain domains per unit volume.

(5) The procedures of the above (1) were repeated to prepare samples Nos. 25–36, samples Nos. 37–48, and samples Nos. 49–60 (on SiO$_2$ film) and also to prepare samples Nos. 25'–36', samples Nos. 37'–48', and samples Nos. 49'–60' (on quartz substrate).

Figure 10:
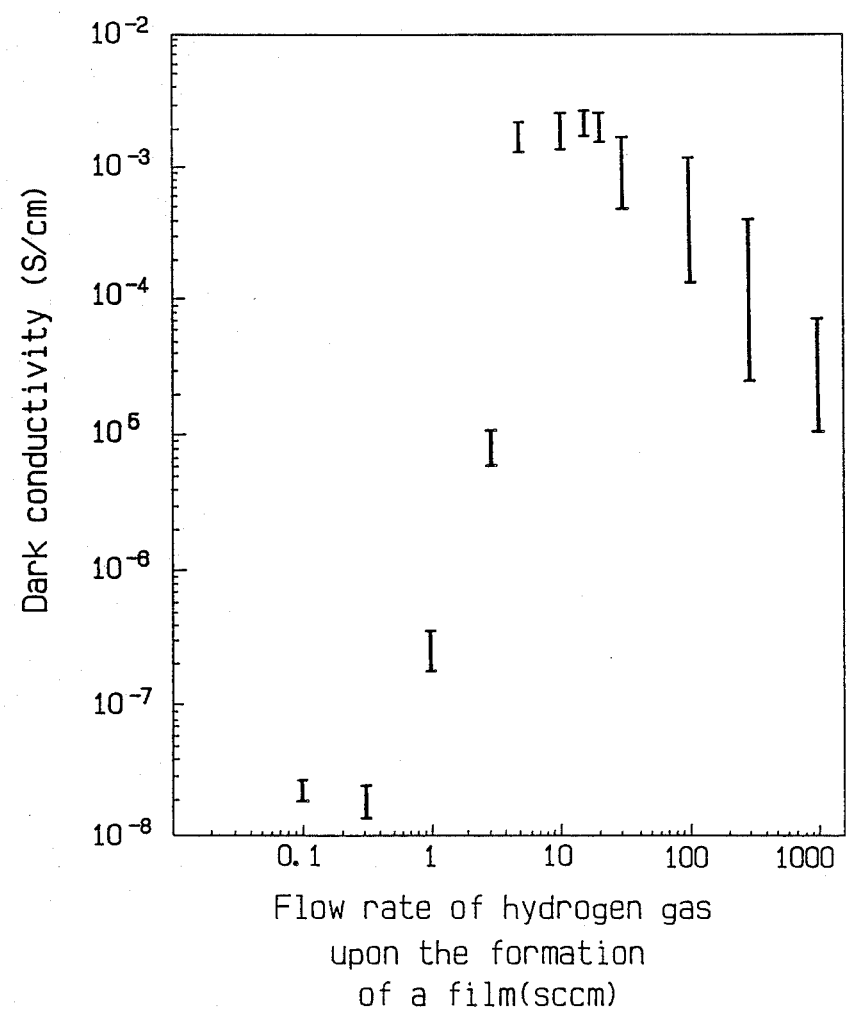
FIG. 10 is a graph showing the interrelations between the dark conductivities and the flow rates of hydrogen gas ($H_2$) at the time of film formation in the below-mentioned Experiment C.

Each of samples Nos. 25–60 which were not irradiated with intense light was examined for dark conductivity in the same manner as mentioned above. The results were as shown in FIG. 10. As FIG. 10 illustrates, it was found that the value of dark conductivity greatly varies depending upon the film forming conditions, and that the degree of said variation is great in the case where the flow rate of hydrogen gas is high.

In the measurements of the content of hydrogen atoms and the proportion of crystal grains per unit volume using Samples Nos. 25'–60', it was found that they are almost uniform in the content of hydrogen atoms (H) and also in the proportion of crystal grain domains per unit volume.

In the case of samples Nos. 25'–60', those which were prepared with a flow rate of hydrogen gas being higher than 30 sccm gave greatly varied values of dark conductivity. In such cases, the content of hydrogen atoms (H) was more than 4 atomic % and the proportion of crystal grain domains per unit volume was less than 65 vol %.

The foregoing suggests that where the proportion of non-crystal grain domains per unit volume exceeds 35 vol %, the crystal grains are electrically separated from one another and the conduction is determined by the non-crystal grain domains, which leads to lowering the dark conductivity. This narrows the application areas of the resulting deposited film. In addition, the control of valence electron and the change of dark conductivity with a dopant to be doped greatly differ from the crystal grain domains to the non-crystal grain domains; therefore, it is difficult to obtain a desired control of valence electron and a desired change of dark conductivity. That is, in the case where dopants enter the non-crystal grain domains, but not into the crystal grain domains, the resulting deposited film greatly varies in its characteristics. This makes it difficult to obtain the dark conductivity as desired.

The dark conductivity greatly varies as shown in FIG. 8 in the case where the deposited film is irradiated with intense light. This may be elucidated in the following way: in the case where the proportion of the non-crystal grain domains per unit volume exceeds 35 vol %, the content of hydrogen atoms (H) is significantly high. This brings about a situation in which the hydrogen atoms will be easily released from the film with the progressive change of time and the environmental change. The release of hydrogen atoms causes deterioration of the characteristics of the film.

The foregoing suggests the following. That is, in order for the ZnSe:H film to be of stable film quality and to be reproducible, it is necessary that the content of hydrogen atoms (H) be 4 atomic % or less and the proportion more.

(6) The procedures in the above step (1) were repeated to form ZnSe:H films and ZnSe:H:Li films on quartz glass substrates under varied film forming conditions. Thus prepared samples were examined for the interrelation between the content of hydrogen atoms (H) and the proportion of crystal grain domains per unit volume, and the interrelation between the content of hydrogen atoms (H) and the electrical characteristics (such as the ratio of change in conductivity under irradiation with AM-1, the drift mobility of holes, and the dark conductivity) in the same manner as mentioned above. It was found that the content of hydrogen atoms (H) and the proportion of crystal grain domains per unit volume almost coincide with those specified in the above-mentioned experiments, and that there is a close correlation between the content of hydrogen atoms in the film and the electrical characteristics of the film. Thus it was found that the optimum content of hydrogen atoms (H) is in the range from 1 to 4 atomic %. It was also found that the proportion of crystal grain domains per unit volume in the film which satisfies the specific content of hydrogen atoms in the film is preferably 65 to 85 vol % and more preferably, 70 to 80 vol %.

Experiment D:

Observations on n-typed doped ZnSe:H:Mn deposited film (Mn is a dopant of n-type)

There were prepared a predetermined number of ZnSe:H:Ga deposited film samples by repeating the procedures of Experiment C, except that $(CH_3)_3Ga$ [TMGa] with a flow rate of $8 \times 10^{-11}$ mol/min in stead of the $LiC_3H_7$.

And various observations were made on the resultant samples in the same manner as in Experiment C. As a result, it was found that ZnSe:H:Ga deposited films containing hydrogen atoms (H) in an amount of from 1 to 4 atomic % and containing crystal grain domains with a proportion of 65 to 85 vol % per unit volume are of stable film quality and reproducible. It was also found that they excel in the semiconductor characteristics.

The present invention has been completed based on the foregoing experimental findings.

That is, the present invention provides an improved pin junction photovoltaic element having a p-type semiconductor layer, an i-type semiconductor layer and an n-type semiconductor layer being stacked which is characterized in that at least the p-type semiconductor layer or the n-type semiconductor layer comprises a non-single crystal film comprised of zinc atoms (Zn), selenium atoms (Se) and at least hydrogen atoms (H)(which is represented by the fomula: ZnSe:H and which contains a p-type dopant) (which is represented by the formula: ZnSe:H:Mp, where Mp is a p-type dopant) or an n-type dopant (which is represented by the formula: ZnSe:H:Mn, where Mn is an n-type dopant), each of said ZnSe:H:Mp film and said ZnSe:H:Mn film containing said hydrogen atoms (H) in an amount of 1 to 4 atomic %, crystal grain domains in a proportion of 65 to 85 vol % per unit volume: and the i-type semiconductor layer comprises (a) a non-single crystal semiconductor film containing silicon atoms as the matrix and at least one kind of hydrogen atoms and fluorine atoms (hereinafter referred to as "Non-Si(H,F) film") or (b) a non-single crystal semiconductor film containing silicon atoms, at least one kind of carbon atoms and germanium atoms, and at least one kind of hydrogen atoms and fluorine atoms (hereinafter referred to as "Non-Si(C,Ge)(H,F) film").

In a preferred embodiment of the pin junction photovoltaic element according to the present invention, it is desired that the p-type semiconductor layer be comprised of the foregoing ZnSe:H:Mp film and the n-type semiconductor layer be comprised of the foregoing ZnSe:H:Mn film. However, as above mentioned, either the p-type semiconductor layer or the n-type semiconductor layer may be comprised of a properly selected non-single crystal semiconductor film of p-type or n-type depending upon the type of the pin junction photovoltaic element.

For example, in the case where the pin junction photovoltaic element is made to be of single-cell type to which light is impinged form the side of its p-type constituent layer and the said p-type constituent layer is constituted by the foregoing ZnSe:H:Mp film, any known n-typed non-single crystal semiconductor film may be optionally used to constitute the n-type constituent layer. As such semiconductor film, there can be mentioned Group IV series semiconductor films such as Si semiconductor film, SiC semiconductor film and SiGe semiconductor film: Group II-VI series semiconductor films such as ZnSe semiconductor film, ZnS semiconductor film, CdS semiconductor film, CdSe semiconductor film and CdTe semiconductor film: and Group III-V series semiconductor films such as AlP semiconductor film, AlAs semiconductor film, AlSb semiconductor film, GaP semiconductor film, GaAs semiconductor film, GaSb semiconductor film, InP semiconductor film and InAs semiconductor film.

In the case where the pin junction photovoltaic element is made to be of tandem-cell type or triple-cell type, an n-type semiconductor film having a narrow band gap is not suitable to constitute their n-type constituent semiconductor layer since the light transmittance of their lower cell will be insufficient when their n-type semiconductor layer is constituted by such semiconductor film. In view of this, it is desired for their n-type semiconductor layer to be constituted by an appropriate n-typed non-single crystal semiconductor film having a wide band gap. As such semiconductor film, there can be mentioned Group IV series semiconductor films such as Si semiconductor film and SiC semiconductor film: Group II-IV series semiconductor films such as ZnSe semiconductor film, ZnS semiconductor film, CdS semiconductor film and CdSe semiconductor film: and Group III-V series semiconductor films such as AlP semiconductor film, AlAs semiconductor film and GaP semiconductor film.

Further, in the case where the pin junction photovoltaic element is made to be of single-cell type and its n-type constituent layer is constituted by the foregoing ZnSe:H:Mn film, its p-type constituent layer may be constituted by any known p-typed non-single crystal semiconductor film.

In this case, the single cell type pin junction photovoltaic element may be so designed that light is impinged either from the side of the n-type semiconductor layer or from the side of the p-type semiconductor layer. In the latter case, the said p-type semiconductor layer is desired to be constituted by an appropriate p-typed non-single crystal semiconductor film having a wide band gap. Examples of the p-typed non-single crystal semiconductor film to constitute the p-type constituent semiconductor layer of the single cell type pin junction photovoltaic element of which n-type constituent semiconductor layer being constituted by the foregoing ZnSe:H:Mn are, for example, Group IV series semiconductor films such as Si semiconductor film, SiC semiconductor film and SiGe semiconductor film: Group II-VI series semiconductor films such as ZnSe-Te:H semiconductor film, ZnTe semiconductor film and CdTe semiconductor film: and Group III–V series semiconductor films such as AlP semiconductor film, AlAs semiconductor film, AlSb semiconductor film, GaP semiconductor film, GaAs semiconductor film, GaSb semiconductor film, InP semiconductor film, InAs semiconductor film and InSb semiconductor film.

In the case where the pin junction photovoltaic element is made to be of tandem-cell type or triple-cell type and their n-type constituent semiconductor layer is constituted by the foregoing ZnSe:H:Mn film, their p-type constituent semiconductor layer is constituted by an appropriate p-typed non-single crystal semiconductor film. Examples of such semiconductor film are, for example, Group IV series semiconductor films such as Si semiconductor film and SiC semiconductor film: Group II-VI series semiconductor films such as ZnTe semiconductor film: and Group III–V series semiconductor films such as AlP semiconductor film, AlAs semiconductor film and GaP semiconductor film.

For the i-type constituent semiconductorllayer of the pin junction photovoltaic element according to the present invention, as above described, it comprises a Non-Si(H,F) film or a Non-Si(C,Ge)(H,F) film. Specific examples of said Non-Si(H,F) film are, for example, amorphous silicon films such as A-Si:H film, A-Si:F film and A-Si:H:F film: and polycrystal silicon films such as poly-Si:H film, polySi:F film and poly-Si:H:F film. Specific examples of said Non-Si(C,Ge)(H,F) film are, for example, amorphous silicon films such as A-SiGe:H film, A-SiGe:F film, A-SiGe:H:F film, A-SiC:H film, A-SiC:F film, A-SiC:H:F film, ASiGe:C:H film, A-SiGe:C:F film and A-SiGe:C:H:F film: and polycrystal silicon films such as poly-SiGe:H film, poly-SiGe:F film, poly-SiGe:H:F film, poly-SiC:H film, polySiC:F film, poly-SiC:H:F film, poly-SiC:Ge:H film, poly-SiC:Ge:F film and poly-SiC:Ge:H:F film.

The foregoing ZnSe:H:Mp film to constitute the p-type semiconductor layer, the foregoing ZnSe:H:Mn film to constitute the n-type semiconductor layer, any of the foregoing non-single crystal semiconductor films to constitute the p-type or the n-type semiconductor layer, any of the foregoing N-Si(H,F) films and the foregoing N-Si(C,Ge)(H,F) films to constitute the i-type semiconductor layer for the pin junction photovoltaic element according to the present invention may be formed on a plane substrate or on a cylindrical substrate according to the intended application, or may be also formed on a film formed on such substrate.

Now, as above described, the ZnSe:H:Mp film to constitute the p-type semiconductor layer for the pin junction photovoltaic element according to the present invention is such that has excellent uniformity of structure and homogeneity of composition: contains Zn atoms and Se atoms in stoichiometric amounts respectively in a state of being uniformly distributed and also contains 1 to 4 atomic % of hydrogen atoms in a state of terminating dangling bonds of at least one kind of said Zn and Se or in a state of being present free: the compositional ratio of said Zn atoms to said Se atoms is stoichiometric: the quantitative ratio of said Zn atoms to said Se atoms is about 1:1 in terms of atomic ratio: crystal grain domains and non-crystal grain domains are contained: and said crystal grain domains are contained in an amount of 65 to 85 vol % by the proportion per unit volume in a state of being distributed in the film.

In addition, the said ZnSe:H:Mp film is that the stress to occur in the entire region is being relaxed in a desired state, and it has outstanding electrical and mechanical characteristics and also has a good adhesion to the substrate on which it is to be deposited and other films on or under which it is to be deposited.

By the way, for the known ZnS series film, it is difficult to incorporate a p-type dopant thereinto in a desired state and because of this, it is difficult to make said film to be of a desired p-conduction type.

However, according to the present invention, as above described, the foregoing ZnSe:H film is such that the dangling bounds are being reduced to a desired low level and that permits easy and effective incorporation of a p-type dopant thereinto. In view of this, according to the present invention, there is provided a desired p-type ZnSe:H:$M_p$ film (where $M_p$ is a p-type dopant). This p-type ZnSe:H:$M_p$ film has outstanding p-type semiconductor characteristics, a desired state in which the stress is being desirably relaxed as mentioned above, very good electrical and mechanical characteristics, and good adhesion not only to the substrate but also to other films.

The p-type dopant of Mp for the ZnSe:H:Mp film may be a member selected from the group consisting of Group IA elements (i.e., Li, Na, K, and Rb), Group IB elements (i.e., Cu and Ag) and Group V-A elements (i.e., P, As, and Sb). Among these elements, Li, P and As are most desired.

The amount of the p-type dopant to be contained in the viewpoint of using the ZnSe:H:$M_p$ film as the p-type semiconductor layer in forming the pin junction is preferably from 50 to $1 \times 10^4$ atomic ppm, more preferably from $5 \times 10^2$ to $1 \times 10^4$ atomic ppm, and most preferably, from $1 \times 10^3$ to $5 \times 10^3$ atomic ppm.

As above described, the n-type semiconductor layer of the pin junction photovoltaic element may be constituted by the foregoing n-type ZnSe:H:Mn (where Mn is an n-type dopant). As well as the said ZnSe:H:$M_p$ film, this ZnSe:H:Mn film has outstanding n-type semiconductor characteristics, a desired state in which the stress is being desirably relaxed as mentioned above, very good electrical and mechanical characteristics, and good adhesion not only to the substrate but also to other films.

As the n-type dopant (Mn), there can be mentioned Group III B elements such as B, Al, Ga and In, Group IV B elements such as Si, Ge, C and Sn, and Group VII B elements such as F, Cl, Br and I. Among these elements, Al, Ga, In and B are most desired.

The amount of the n-type dopant to be contained in the viewpoint of using the ZnSe:H:Mn film as the n-type semiconductor layer in forming the pin junction is preferably from 50 to $1 \times 10^4$ atomic ppm, more preferably from $5 \times 10^2$ to $1 \times 10^4$ atomic ppm, and most preferably, from $1 \times 10^3$ to $5 \times 10^3$ atomic ppm.

As mentioned above, the above functional deposited ZnSe:H:M film (where M is a dopant of p-type or n-type) to be used in the present invention is characterized by (i) the content of hydrogen atoms being in the specific range and (ii) the proportion of crystal grain domains per unit volume being also in the specific range. As for the hydrogen content, when it is less than 1 atomic %, the resulting deposited film becomes unsatisfactory on account of an excessive amount of dangling bonds. In the case when it exceeds 4 atomic %, the resulting deposited film becomes also unsatisfactory because of occurrence of lattic disturbance, generation of void and also increase of defects. With respect to the proportion of crystal grain domains per unit volume, in the case where it is less than 65 vol %, the absolute amount of crystal grains being one of the factors to contribute in promotion of the electrical properties is reduced. And, in the case where it is in excess of 85 vol %, crystal grains are directly bonded each other to case formation of the so-called grain boundaries resulting in occurrence of defects due to lattice incomensurateness, etc. Therefore, in any case, there cannot be obtained a desired deposited film having the characteristics as desired.

As above described, the foregoing ZnSe:H:M film to be used in the present invention contains a specific amount of hydrogen atoms and a specific proportion of crystal grain domains per unit volume and is specific in the composition and the structure as above described, and because of this, defects in the film are being significantly reduced and it is greately surpassing any of the known ZnSe:M series films particularly in view of the electrical conductivity.

This situation is apparent particularly in the case of using the foregoing ZnSe:H:Mp film. And as described above, the ZnSe:H:Mp film to constitute the p-type semiconductor layer of the pin junction photovoltaic element according to the present invention has a desirably wide band gap of 2.67 eV which is effective for making almost all incident ray to be absorbed not by the p-type semiconductor layer but by the i-type semiconductor layer, so that photocurrent is efficiently outputted. There is made a significant improvement for the photocurrent to be outputted in the case where the i-type semiconductor layer is formed from a A-Si semiconductor film or a A-SiC semiconductor film because a loss of short-wavelength light to be absorbed by the p-type semiconductor layer is remarkably reduced. This effect by the use of the ZnSe:H:Mp film as the p-type semiconductor layer is brought about not only in the case of single-cell photovoltaic element but also in the case of multicells stacked photovoltaic element.

Further, as for the ZnSe:H:Mp film to be used in the present invention, as it is accompanied with few defect as above described, if there should be an occasion for incident light to be absorbed by the p-type semiconductor layer comprised of the said film, there is a slight probability for electrons generated therein to be recombined and they have a certain extent of diffusion distance, and because of this, such electrons will become to contribute to providing photocurrent.

In view of this, for the pin junction photovoltaic element having the p-type semiconductor layer comprised of the ZnSe:H:Mp film, a larger output of photocurrent than expected only from the largeness of its band gap will be made.

Further in addition, in the case where the i-type semiconductor layer is formed from a A-SiGe semiconductor film or poly-Si semiconductor film respectively capable of absorbing long-wavelength light, electrons to be generated in the said i-type semiconductor layer are prevented from reverse-diffusing at the interface between the p-type semiconductor and the i-type semiconductor layer because of the largeness of a gap between the resulting conduction bands caused by the matching between the band gap of the said ZnSe:H:Mp film and that of the said A-SiGe semiconductor film or poly-Si semiconductor film (in other words, because of the so-called back surface field effect), and because of this, a large output of photocurrent is expected.

The thus structured pin junction photovoltaic element according to the present invention is high in the transmission for short-wavelength light and provides a high photoelectric conversion efficiency for short-wavelength light mainly because of using the foregoing ZnSe:H:M film which is free of problems caused by in-film defects which are found on the known pin junction photovoltaic element.

This feature makes it possible for the photovoltaic element according to the present invention to apply to solar cell where it achieves more efficient photoelectric conversion than conventional ones made of amorphous silicon material even when used under a light source such as white-light fluorescent lamp which emits such light having a large quantity of short-wavelength light in its spectral components. In addition, the photovoltaic element according to the present invention also exhibits significant effects when applied to solar cell to be used under sunlight. For instance, when it is employed as the cell in the side where light is impinged in a solar cell of tandem type or triple type, the resulting device becomes to have a structure that permits efficient supply of long-wavelength light into the lower cell and provides a significant improvement in the photoelectric conversion efficiency for short-wavelength light. Because of this, it functions to efficiently convert almost all the spectra of sunlight into electricity. In addition, it can be continuously used for a long period of time without occurrence of problems relating to light-induced fatigue which is often found on the conventional solar cell of tandem type or triple type.

The following describes typical examples of the pin junction photovoltaic element to be provided according to the present invention in which at least the p-type semiconductor layer or the n-type semiconductor layer comprises the foregoing ZnSe:H:Mp film or the foregoing ZnSe:H:Mn film.

The following description, however, is not intended to limit the scope of the present invention.

Figure 1B:
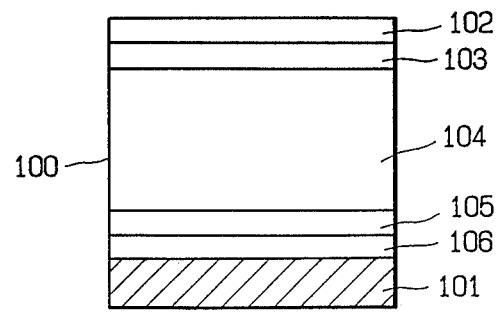
FIG. 1(B) is a schematic cross-sectional view of another typical pin junction photovoltaic element according to the present invention.
Figure 1C:
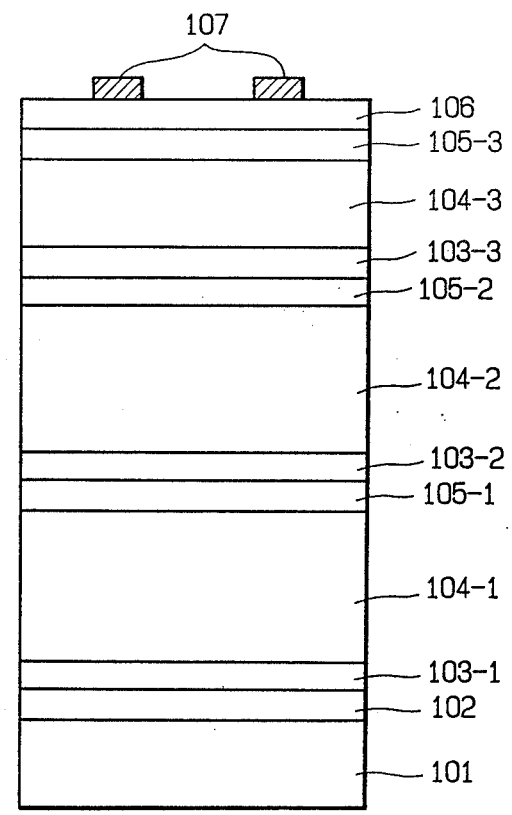
FIG. 1(C) is a schematic cross-sectional view of a typical multicells-stacked photovoltaic element according to the present invention.

FIG. 1(A), FIG. 1(B) and FIG. 1(C) schematically illustrate typical embodiments of the pin junction photovoltaic element according to the present invention which has a layer structure based on the foregoing ZnSe:H:M (M is a dopant of p-type or n-type).

FIG. 1(A) is a schematic cross-sectional view of a first representative embodiment of the pin junction photovoltaic element according to the present invention. In FIG. 1(A), there is shown a pin junction photovoltaic element 100 having a structure comprising electrode 102, n-type semiconductor layer 103, i-type semiconductor layer 104, p-type semiconductor layer 105, transparent electrode 106 and collecting electrode 107 being disposed in this order on substrate 101.

In the pin junction photovoltaic element shown in FIG. 1(A), light is impinged from the side of the transparent electrode 106.

FIG. 1(B) is a schematic cross-sectional view of a second representative embodiment of the pin junction photovoltaic element according to the present invention.

In FIG. 1(B), there is shown a pin junction photovoltaic element 100 comprising transparent electrode 106, p-type semiconductor layer 105 i-type semiconductor layer 104, n-type semiconductor layer 103 and electrode 102 being disposed in this order on transmissive substrate 101. In the pin junction photovoltaic element shown in FIG. 1(B), light is impinged from the side of the transmissive substrate 101.

For any of the above pin junction photovoltaic elements shown in FIG. 1(A) and FIG. 1(B), it is possible to put each of the n-type semiconductor layer and the p-type semiconductor layer in the others place in accordance with the use purpose.

FIG. 1(C) is a schematic cross-sectional view of a third representative embodiment of the pin junction photovoltaic element according to the present invention which is a multicells stacked photovoltaic element.

In FIG. 1(C), there is shown a multicells (triple-cells) stcked photovoltaic element 100 comprising: substrate 101: a lower cell unit which comprises electrode 102, n-type semiconductor layer 103-1, i-type semiconductor layer 104-1 and p-type semiconductor layer 105-1; an intermediate cell unit which comprises n-type semiconductor layer 103-2, i-type semiconductor layer 104-2 and p-type semiconductor layer 105-2: an upper cell unit which comprises n-type semiconductor layer 103-3, i-type semiconductor layer 104-3 and p-type semiconductor layer 105-3: transparent electrode 106 (comprised of a ITO film): and collecting electrode 107.

Explanation will be made for the substrate, each constituent semiconductor layer and each constituent electrode in the pin junction photovoltaic element of the present invention.

Substrate

The substrate 101 used in the pin junction photovoltaic element according to the present invention may be of single crystal material or non-single crystal material. It may be electroconductive or electrically insulating, and it may be transparent or opaque. Usable as such substrate are, for example, Fe, Ni, Cr, Al, Mo, Au, Nb, Ta, V, Ti, Pt, and Pb and alloys thereof such as brass and stainless steel. Other than these, there can be mentioned films or sheets of synthetic resin such as polyester, polyethylene, polycarbonate, cellulose acetate, polypropylene, polyvinyl chloride, polyvinylidene chloride, polystyrene, polyamide, polyimide and the like, and other than these glass or ceramics.

Examples of the substrate comprising a single crystal material are, for example, wafer-like shaped members obtained by slicing an appropriate single crystal of Si, Ge, C, NaCl, KCl, LiF, GaSb, In As, In Sb, GaP, MgO, $CaF_2$. $BaF_2$, $\alpha$-$Al_2O_3$ or the like. The surface of any of said wafer-like shaped members may be provided with an epitaxially grown layer of the same constituent(s) as the member or of a material whose lattice constant being close to that of the constituent(s) of the member.

The shape of the substrate may be optionally determined in accordance with the end use purpose. Examples are plate, belt, drum and suitable like shapes having a plane or uneven surface. The thickness of the substrate is properly determined so that the layer structure as the photovoltaic member can be formed as desired. In the case where flexibility is required for the photovoltaic element to be prepared, it can be made as thin as possible within a range capable of sufficiently providing the functions as the substrate. However, the thickness of the substrate is usually not less than 10 μm from the view points of its manufacturing and handling conveniences and its strength.

Electrodes

In the photovoltaic element according to the present invention, an appropriate electrode is optionally used in accordance with the configuration of the photovoltaic element to be prepared. As such electrode, there can be mentioned lower electrode, upper electrode (transparent electrode) and collecting electrode. Said upper electrode denotes the one to be placed at the side through which light is impinged, and said lower electrode denotes the one to be placed opposit to the upper electrode through the semiconductor layers to be arranged between the two electrodes.

These electrodes will be explained in the following.

(i) Lower electrode

For the pin junction photovoltaic element according to the present invention, the side through which light is impinged is determined depending upon whether there is used a transmissive member or an untransmissive member as the substrate 101.

In this connection, the position where the lower electrode 102 is to be placed is properly determined upon the kind the substrate 101 to be used. For example, in the case where an untransmissive member such as metal member is used as the substrate 101, light for the generation of a photoelectromotive force is impinged from the side of the transparent electrode 106.

Now, in the case where the pin junction photovoltaic element is of the configuration as shown in FIG. 1(A) or FIG. 1(C), the lower electrode 102 is desired to be placed between the substrate 101 and the n-type semiconductor layer 103 or 103-1. In this case, if the substrate 101 is the one which comprises a electroconductive member, it can function also as the lower electrode. However, in the case where the substrate 101 is electroconductive but is of a high sheet resistance, the lower electrode may be disposed as a low-resistant electrode serving to output a photocurrent or in order to heighten the reflectivity of the incident light at the surface of the substrate 101 so as to make it utilized more efficiently.

In the case of FIG. 1(B), there is used a transmissive member as the substrate 101 and light is impinged from the side of the substrate 101. In this connection, the lower electrode 102 serving to output a photocurrent is placed on the surface of the top semiconductor above the substrate 101. However, in the case where there is used an electrically insulating member as the substrate 101, the lower electrode 102 serving to output a photocurrent is placed between the substrate 101 and the n-type semiconductor layer 103.

The electrode 102 may be a metallic thin film of a metal selected from the group consisting of Ag, Au, Pt, Ni, Cr, Cu, Al, Ti, Zn, Mo and W. Said metallic thin film may be properly formed by way of the known vacuum deposition technique, electron-beam deposition technique or reactive sputtering technique. However, due consideration shall be made for the metallic thin film to be thus formed not to be a resistant component for the photovoltaic element. In this respect, the metallic thin film to constitute the electrode 102 is desired to be such that has a sheet resistance of preferably, 50Ω or less, more preferably 10 or less.

In alternative, it is possible to place a diffusion preventive layer comprising a electroconductive material such as zinc oxide between the lower electrode and the n-type semiconductor layer. (This is not shown)

In the case where such diffusion preventive layer is placed in the way as above mentioned, the following advantages will be expected: (a) it prevents the metal elements constituting the electrode 102 from diffusing into the n-type semiconductor layer 103; (b) being provided with a certain resistance value, it prevents occurrence of shorts, which would otherwise occur between the lower electrode 102 and the transparent electrode 106 through the semiconductor layers being arranged between them due to pinholes and the like; and (c) it serves to generate multiple interferences with the thin film and confines the light as impinged within the photovoltaic element.

(ii) Upper electrode (transparent electrode)

The transparent electrode 106 is desired to have a light transmittance of more than 85% so that it serves to make the semiconductor layer to efficiently absorb sunlight or fluorescent light. In addition to this, it is desired to have a sheet resistance of 100Ω or less from the viewpoint of preventing the internal resistance of the photovoltaic element from becoming great to result in impairing the performance.

In view of the above, the transparent electrode 106 is desired to comprise a thin film of a metal oxide selected from the group consisting of $SnO_2$, $In_2O_3$, ZnO, CdO, $Cd_2SnO_2$ and ITO ($In_2O_3 + SnO_2$) or a semitransparent thin film of a metal selected from the group consisting of Au, Al and Cu.

The transparent electrode 106 is disposed on the p-type semiconductor layer 105 or 105-3 in the case of the photovoltaic element shown in FIG. 1(A) or FIG. 1(C), and it is disposed on the substrate 101 in the case of the photovoltaic element shown in FIG. 1(B).

In any of the cases, it is necessary to constitute the transparent electrode 106 with a thin film member selected from the foregoings which is good in adhesion with the layer or the substrate.

The transparent electrode 106 comprising such thin film may be formed by way of the known resistance heating deposition technique, electron-beam heating deposition technique, reactive sputtering technique or spraying technique.

(iii) Collecting electrode

The collecting electrode 107 in the photovoltaic element according to the present invention is disposed on the transparent electrode 106 for the purpose of reducing the surface resistance of said transparent electrode.

The collecting electrode 107 is desired to comprise a metallic thin film of Ag, Cr, Ni, Al, Ag, Au, Ti, Pt, Cu, Mo, W or alloy of these metals. It is possible for the collecting electrode 107 to be constituted with a member comprising a plurality of such metallic thin films being stacked.

The shape and the area of the collecting electrode 107 are properly designed so that a sufficient quantity of light be impinged into the semiconductor layer.

Specifically as for the shape, it is desired to be such that extends uniformly all over the light receiving face of the photovoltaic element. As for the area, it is desired to correspond to a 15% or less in a preferred embodiment or a 10% or less in a more preferred embodiment respectively of said light receiving face.

And the member of constituting the collecting electrode 107 is desired to be such that has a sheet resistance of preferably 50Ω or less, more preferably, 10Ω or less.

p-type semiconductor layer, i-type semiconductor layer and n-type semiconductor layer In a most preferred embodiment of the pin junction photovoltaic element according to the present invention, its p-type semiconductor layer is formed from the foregoing ZnSe:H:Mp film.

This situation is more clarified by the experimentally obtained results in the following.

As the semiconductor material having a relatively wide band gap, there are known semiconductive materials comprising Group II and Group VI elements of the Periodic Table such as ZnS, ZnSe, ZnTe, CdS, CdSe and ZnO.

As for said ZnTe and CdTe of the above mentioned semiconductive materials, it is possible to form a p-type semiconductor film of ZnTe or CdTe by way of the known film-forming method. However, any of the resultant p-type ZnTe film (that is ZnTe:Mp film) and p-type CdTe film (that is CdTe:Mp film) is accompanied with defects in an undesired state, and there is not found any improvement in the output of photocurrent for a pin junction photovoltaic element of which p-type semiconductor layer being constituted even by said p-type ZnTe film or p-type CdTe film.

And, the present inventors have tried to prepare a plurality of pin junction photovoltaic elements of the configuration shown in FIG. 1(B) using (i) A-Si:H:F film, poly-Si:H:F film, A-SiC:H:F film, A-SiGe:H:F film, A-Si film, A-SiGe film, A-SiC film and poly-Si film for the i-type semiconductor layer; (ii) ZnSe:Mp film, ZnTe:Mp film, CdTe:Mp film, and the foregoing ZnSe:H:Mp film according to the present invention for the p-type semiconductor layer: and (iii) A-Si:H:F:Mn film, A-SiGe:H:F:Mn film, A-SiC:H:F:Mn film and poly-Si:H:Mn for the n-type semiconductor layer as shown in Table 3.

In every trial, there was used a quartz glass plate as the substrate 101, a ITO thin film formed by the reactive sputtering method as the transparent electrode 106, and a Ag thin film formed by the known electron-beam heating method as the electrode 102.

As for said ZnSe:H:Mp film according to the present invention, it was prepared in accordance with the method (1) according to the present invention which will be later described.

Other aforementioned films were prepared respectively by the known reactive sputtering method.

Among the thus prepared pin junction photovoltaic element samples, those belonging to the present invention were indicated in the column "present invention" of Table 3.

Other pin junction photovoltaic element samples were indicated in the column "Comparative Example (I)" of Table 3.

In the column "Comparative Example (II)" of Table 3, there were indicated pin junction photovoltaic element samples having a p-type semiconductor layer comprising the ZnSe:H:Li film according to the present invention: an i-type semiconductor layer comprising an i-type semiconductor film containing neither hydrogen atoms nor fluorine atoms selected from the group consisting of A-Si film, poly-Si film, A-SiC film and A-SiGe film: and an n-type semiconductor layer comprising A-Si:H:P film.

Each of the above pin junction photovoltaic element samples was evaluate with practical acceptability as a desired pin junction photovoltaic element mainly from the viewpoints of short-circuit photocurrent (Isc) and open-circuit voltage (Voc).

The evaluation results obtained were shown in Table 3.

As Table 3 illustrates, it is understood that: (i) the pin junction photovoltaic elements having a p-type semiconductor layer a comprising a ZnSe:Li film, a ZnTe:P film or CdTe:Li film; an i-type semiconductor layer comprising a A-Si:H:F film, a poly-Si:H:F film, a A-SiC:H:F film or a A-SiGe:H:F film; and an n-type semiconductor layer comprising a A-Si:H:P are mostly not practically usable except three cases which seem acceptable, and (ii) the pin junction photovoltaic elements having a p-type semiconductor layer comprising a ZnSe:H:Li belonging to the foregoing ZnSe:H:Mp film according to the present invention; an i-type semiconductor layer comprising a A-Si film, a poly-Si film, a A-SiC film or a A-SiGe film; and an n-type semiconductor layer comprising a A-Si:H:P film are all not practically usable.

On the other hand, it is understood that any of the pin junction photovoltaic elements having a p-type semiconductor layer comprising a ZnSe:H:Li film belonging to the foregoing ZnSe:H:Mp film; an i-type semiconductor layer comprising a A-Si:H:F film, a poly-Si:H:F film, a A-SiC:H:F film or A-SiGe:H:F film; and an n-type semiconductor layer comprising a A-Si:H:P film is satisfactory in all the evaluation items and desirably acceptable in practical use.

In view of the above and also in view of the results in the aforementioned Experiments A through D, it is recognized that the combined use of the foregoing ZnSe:H:Mp film as the p-type semiconductor layer and a A-Si(H,F) film, a poly-Si(H,F) film or a A-Si(C,Ge)(H,F) film as the i-type semiconductor layer makes it possible to provide a desired pin junction photovoltaic element which excels in the characteristics required for a pin junction photovoltaic element to be immobilized as an usable product.

Likewise, it is recognized that there may be afforded a desired pin junction photovoltaic element also in the case where the foregoing ZnSe:H:Mn film is used as the n-type semiconductor layer together with any of the foregoing i-type A-Si(H,F) film, poly-Si(H,F) film and A-Si(C,Ge)(H,F) film as the i-type semiconductor layer.

Further, it is recognized that there may be afforded a most desirable pin junction photovoltaic element in the case where there are used the foregoing ZnSe:H:Mp film as the p-type semiconductor layer, any of the said i-type non-single crystal films as the i-type semiconductor layer and the foregoing ZnSe:H:Mn film as the n-type semiconductor layer in combination.

Now, as for the preparation of the pin junction photovoltaic element according to the present invention, it is desired to continuously carry out the formation process of the n-type semiconductor layer, the formation process of the i-type semiconductor layer and the formation process of the p-type semiconductor layer. To be more specific in this respect, the three processes are continuously carried out in the same film deposition apparatus. Alternatively, they are separately carried out in respective deposition apparatuses being continuously connected through gate valves. In this case, the formation of the n-type semiconductor layer on a substrate is conducted in a first film deposition apparatus, then the resulting is transferred into a second film deposition apparatus under vacuum condition and the i-type semiconductor layer is formed on the previously formed n-type semiconductor layer therein, and the resulting is transferred into a third film deposition apparatus under vacuum condition and the p-type semiconductor layer is formed on the previously formed n-type semiconductor layer.

In the meantime, any of the foregoing semiconductor films according to the present invention i.e. The foregoing ZnSe:H:Mp semiconductor film and the foregoing ZnSe:H:Mn semiconductor film may be effectively prepared in accordance with one of the following three processes (1) through (3).

(1) A process for preparing a functional deposited film comprised of ZnSe:H which comprises the steps of introducing a Se-containing raw material gas and hydrogen gas ($H_2$) into an activation space independent of the film-forming space; applying activation energy to these gases to form Se-containing precursor and hydrogen radicals in atomic state; introducing said precursors and hydrogen radicals into the film-forming space; simultaneously introducing a Zn-containing raw material gas into said film-forming space; and causing said gases to chemically react with each other in the space surrounding the surface of a substrate maintained at elevated temperature in said film-forming space.

(2) A process for preparing a functional deposited film comprised of ZnSe:H which comprises the steps of introducing a Se-containing raw material gas, hydrogen gas ($H_2$) and a Zn-containing gas and a into the film-forming space in which a substrate is arranged; mixing said gases; applying a high-frequency power to a cathode installed in said film-forming space to thereby produce plasmas in the reaction space of the film-forming space; and causing said gases to chemically react with one another through decomposition, polymerization, radicalization, and ionization.

(3) A process for preparing a functional deposited film comprised of ZnSe:H which comprises the steps of introducing an Ar gas and $H_2$ gas into the film-forming space in which a substrate is arranged and a cathode is arranged opposite to said substrate while leaving a certain distance between them, said cathode being provided on the surface thereof with a target of polycrystal ZnSe; applying a high-frequency power to said cathode to thereby perform the sputtering of said polycrystal ZnSe and form plasma atmosphere environment in said film-forming space; and causing Se and Zn in atomic state emitted from the target and hydrogen in atomic state formed by the plasma exitation of the $H_2$ gas to chemically react with one another in the space surrounding the surface of the substrate.

The functional deposited film prepared by any of the above-mentioned three processes (1) to (3) may be given desired semiconductor characteristics by the introduction of an appropriate dopant. Particularly, it is possible to introduce a p-type dopant into the ZnSe:H film. This makes it possible to provide a ZnSe:H:Mp film having the p-type conductivity. The doping in this case may be accomplished by introducing a gas containing a p-type dopant, alone or in combination with hydrogen gas, into the film-forming space. Needless to say, it is also possible to prepare an n-type semiconductor film from the ZnSe:H film by using a gas containing an n-type dopant in the same manner as in the preparation of p-type semiconductor film.

The above-mentioned processes (1) to (3) of the present invention will be described in more detail in the following.

Processes (1) and (2)

As the raw material to introduce Zn ("raw material A" for short), an easily gasifiable alkyl zinc compound represented by the formula: $(R)_2-Zn$ (where R denotes an alkyl residue having 1 to 4 carbon atoms) is used. Typical examples of the alkyl zinc compound include dimethyl zinc (DMZn) and diethyl zinc (DEZn). Being liquid at room temperature, these organozinc compounds are gasified by bubbling with an inert gas carrier such as Ar and He at the time of their use.

As the raw material to introduce Se ("raw material B" for short), a gaseous or easily gasifiable hydrogen selenide ($H_2Se$), selenium halide, or alkyl selenium compound represented by the formula: $(R')_2$—Se (where R' denotes an alkyl residue having 1 to 4 carbon atoms) is used. Preferred examples of the selenium halide include selenium hexafluoride. Preferred examples of the alkyl selenium compound include dimethyl selenium (DMSe) and diethyl selenium (DESe).

Among the compounds to be the raw material B, those which are not gaseous but liquid or solid at room temperature are gasified at the time of their use by bubbling with an inert carrier gas such as Ar and He, or by sublimation with heating.

In the preparation of the ZnSe:H film by the process (1) or (2), $H_2$ gas is purposely used.

According to a preferred embodiment of the process (1), the gaseous raw material B and $H_2$ gas in combination are introduced into an activation space, where they are excited with the action of an activation energy to form active species. In the case of using non-gaseous raw material B, the activation space may be constructed such that the non-gaseous raw material B is gasified by the aid of aforesaid inert gas or $H_2$ gas, and the gas thus formed is excited with the action of an activation energy.

Needless to say, in the process (1), it is possible to introduce $H_2$ gas alone into a separate activation space independent of said activation space, where the $H_2$ gas is excited with the action of an activation energy.

The above activation energy may be discharge energy, thermal energy, or light energy, or a combination thereof.

The excitation of the raw material B may be accomplished by the aid of a proper catalyst as well as the activation energy.

The above-mentioned process (1) or (2) of the present invention may be practiced in the following manner to prepare the p-type or n-type ZnSe:H:M film. That is, a gaseous raw material to provide a p-type dopant or n-type dopant ("p-type dopant raw material" or "n-type dopant raw material" for short) is introduced, alone, or together with the gaseous raw material A or the gaseous raw material B, or together with $H_2$ gas.

As the p-type dopant raw material, a gaseous or easily gasifiable compound is used. Examples of the p-type dopant raw material include organolithium compounds such as propyl lithium ($LiC_3H_7$) and sec-butyl lithium ($Li(sec-C_4H_9)$) which are liquid at room temperature; and inorganic lithium compounds such as lithium sulfide ($Li_2S$) and lithium nitride ($Li_3N$) which are solid at room temperature. Additional preferred examples include $AsH_3$, $PH_3$, $P_2H_4$, $AsF_3$, $AsCl_3$, $PF_5$, $PF_3$, $PCl_3$, $SbH_3$, and $SbF_3$.

The n-type dopant raw material, like the p-type dopant raw material, may be a member selected from those compounds which are gaseous at room temperature or easily gasifiable. Preferred examples of such compounds include trimethyl aluminum ($Al(CH_3)_3$), triethyl aluminum ($Al(C_2H_5)_3$), trimethyl gallium ($Ga(CH_2)_3$). triethyl gallium ($Ga(C_3H_5)_3$), trimethyl indium ($In(CH_3)_3$), triethyl indium ($In(C_2H_5)_3$), diborane ($B_2H_6$), monosilane ($SiH_4$), disilane ($Si_2H_6$), monogermane ($GeH_4$), tin hydride ($SnH_4$), methane ($CH_4$), ethane ($C_2H_6$), ethylene ($C_2H_4$). acetylene ($C_2H_2$), fluorine ($F_2$). and chlorine ($Cl_2$).

In the case where the p-type or n-type dopant raw material is liquid at room temperature, it is gasified at the time of use by bubbling with an inert gas such as Ar or He or $H_2$ gas as a carrier gas. In the case where the p-type or n-type dopant raw material is solid at room temperature, it is gasified at the time of use by sublimation with heating by the aid of a carrier gas such as Ar and He in a sublimation furnace.

In the case where the p-type or n-type ZnSe:H:M film is prepared by the above-mentioned process (1), the dopant raw material is preferably introduced into the activation space together with the gaseous raw material B and $H_2$ gas.

The above-mentioned process (1) or (2) of the present invention may be practiced in the following manner to prepare the p-type or n-type ZnSe:H:M film. That is, the substrate is maintained preferably at a temperature of 50° to 600° C., more preferably at a temperature of 50° to 500° C., and most preferably, at a temperature of 100° to 400° C. during the film formation process. So long as the substrate temperature is in the range of 50° to 600° C., usually there is obtained a deposited film in which crystal grain domains and non-crystal grain domains coexist, wherein the amount of hydrogen radicals or the flow rate of $H_2$ gas is changed during the film formation process.

One of the important film forming factors in the above-mentioned process (1) and (2) is the inner pressure of the film-forming space upon forming the desired film.

And it is preferably from $1 \times 10^{-4}$ to 50 Torr, more preferably from $5 \times 10^{-3}$ to 10 Torr, and most preferably, from $1 \times 10^{-3}$ to 5 Torr. In practice of this respect, the gaseous raw material A, the gaseous raw material B, hydrogen gas ($H_2$), and the gaseous dopant (p-type or n-type) raw material are introduced while being controlled through respective mass flow controllers at respective flow rates predetermined upon the kind of the semiconductor film to be prepared and while maintaining the inner pressure of the film-forming space at a value in the above range.

In the case of the process (1), the gaseous raw material A and the gaseous raw material B and the hydrogen radicals in atomic state are introduced into the film-forming space at a predetermined ratio. Said ratio, that is, the ratio of the sum of the respective flow rates for the two gaseous raw materials A and B versus the amount of the hydrogen radicals, is properly determined upon the kinds of the said two raw materials to be used and also the characteristics desired for the film to be prepared. However, in general, it is preferably from 1:10 to 1:$10^4$, and more preferably, from 1:25 to 1:$10^3$.

Likewise, in the case of the process (2), the ratio of the sum of the flow rate for the gaseous raw material A and the flow rate for the gaseous raw material B versus the flow rate for the hydrogen gas ($H_2$) is properly determined upon the interrelations among the high frequency power to be applied, the inner pressure of the film-forming space and the amount of hydrogen atoms to be incorporated into the film to be prepared. However, in general, it is preferably from 1:20 to 1:$5 \times 10^4$, and more preferably, from 1:30 to 1:$5 \times 10^3$.

Process (3)

This process is designed to prepare the abovementioned ZnSe:H film and the foregoin p-type or n-type ZnSe:H:M film by means of sputtering, as mentioned above.

The target to be used is typically polycrystal ZnSe. It may also be possible to use two targets of Zn and Se. In the case where the sputtering is performed by the application of high-frequency power to the target, it is preferable to form a gas atmosphere composed of H$_2$ gas and Ar gas and/or He gas.

In the case of preparing the p-type or n-type ZnSe:H:M film in accordance with the process (3), the above sputtering is performed in a gas atmosphere composed of H$_2$ gas and Ar gas and/or He gas and also the foregoing gaseous p-type or n-type dopant raw material.

Figure 3:
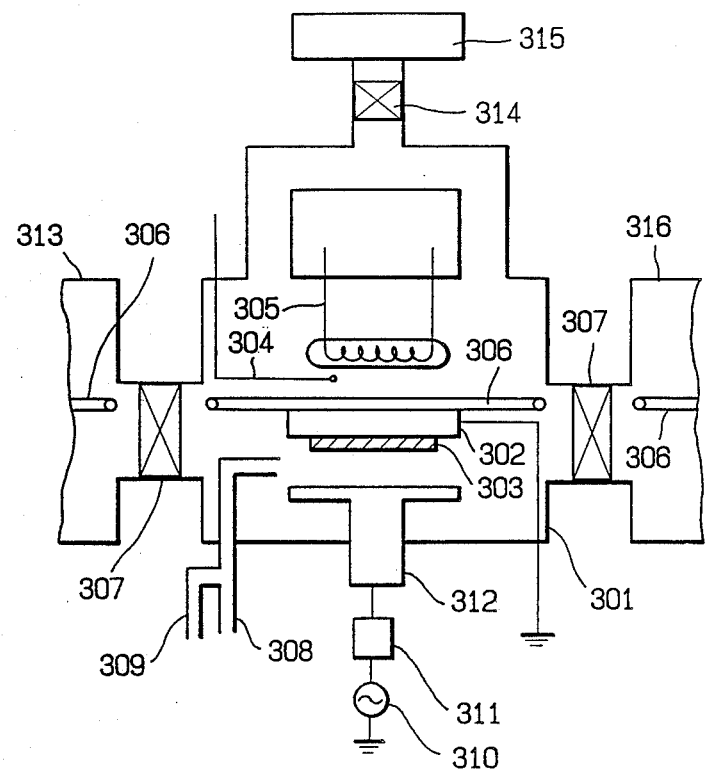
FIG. 3 is a schematic diagram to illustrate a representative apparatus suitable for practicing the later described process (2) of forming a constituent layer for any of the above photovoltaic elements according to the present invention.
Figure 4:
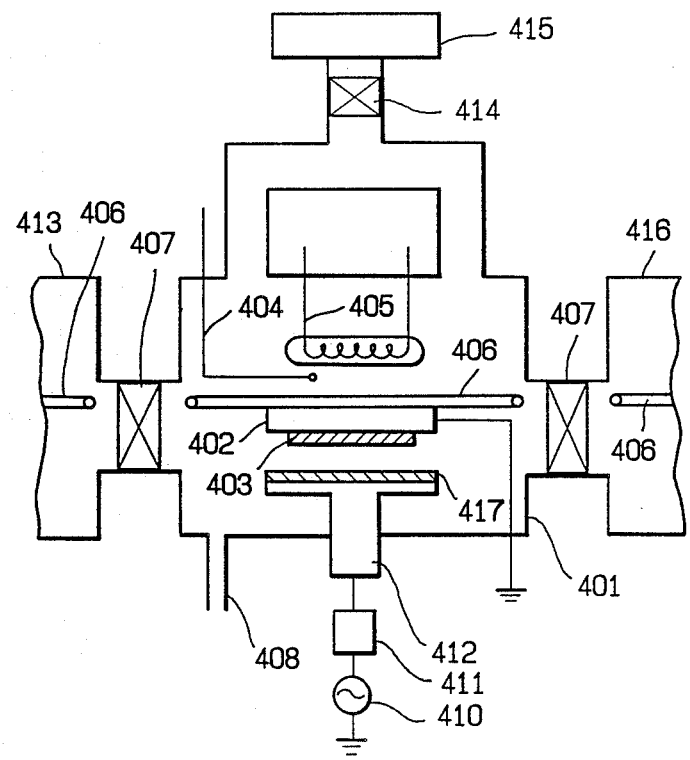
FIG. 4 is a schematic diagram to illustrate a representative apparatus suitable for practicing the later described process (3) of forming a constituent layer for any of the above photovoltaic elements according to the present invention.

In the preparation of the p-type or n-type ZnSe:H:M film is produced according to process (3), the important film-forming conditions include the target-to-substrate distance, the high-frequency power, the substrate temperature, the inner pressure, and the gas flow rate. The target-to-substrate distance may vary depending on the construction and scale of the equipment used. In general, it is preferably from 20 to 100 mm, and more preferably, from 40 to 80 mm. The high-frequency power may vary depending upon the type and size of the target. In general, it is preferably from 0.3 to 7 W/cm$^2$, and most preferably, from 0.8 to 4 W/cm$^2$. As for the substrate temperature, it is adjusted to the same range as in the above-mentioned process (1) or (2). As for the inner pressure at the time of forming the film, it is preferably from $1 \times 10^{-5}$ to $1 \times 10^{-1}$ Torr, and more preferably, from $1 \times 10^{-4}$ to $1 \times 10^{-2}$ Torr. The H$_2$ gas and Ar gas and/or He gas and the gaseous p-type or n-type dopant raw material are properly controlled in relation to the amounts of Zn and Se in atomic state which are emitted from the target during the sputtering. The respective flow rates of the above gases are controlled by mass flow controllers such that the gas atmosphere in the reaction zone of the film-forming space contains a prescribed amount of hydrogen atoms (H) or a prescribed sum amount of hydrogen atoms (H) and dopant (M)(or H+M). In this case, the film-forming space is evacuated such that the above-mentioned internal pressure is maintained. And it is desired to establish a certain ratio between the sum amount of Zn and Se in atomic state and the sum amount of hydrogen atoms (H) and dopant (M)(H+M). It is preferably from $10^2$:1 to 1:$10^3$, more preferably from 10:1 to 1:$10^2$, and most preferably, from 5:1 to 1:50. Any of the above-mentioned process (1) to (3) may be practiced using a proper apparatus. Typical examples of such apparatus are shown in FIGS. 2 to 4.

FIG. 2 schematically shows a preferred example of the apparatus suitable to practice the process (1) of the present invention. In FIG. 2, there is shown a film forming chamber 201 in which is installed a substrate holder 202. There is shown a substrate 203 which is fixed onto the substrate holder 202. The substrate 203 is heated by radiation from an infrared heater 205, while being monitored by a temperature monitor 204. The substrate holder 202 is transferred to the other film forming chamber 213 or a load lock chamber 212 through a gate valve 207 by a substrate transfer unit 206. Raw material gas (A) is introduced into the film forming chamber 201 through the gas inlet pipe (A) 208. Raw material gas (B) and hydrogen gas are introduced through the gas inlet pipe (B) 209. The gases are activated in an activation region 210 by an activation means 211, and then introduced into the film forming chamber 201.

The activation means may be any means to decompose, polymerize, radicalize, or ionize raw material gases (A) and (B) and hydrogen gas by the aid of electric energy of direct current, high-frequency, or microwave, or by the aid of light energy, or heat energy, or by the aid of catalyst, to thereby promote the reactions among the raw material gases (A) and (B) and hydrogen gase and also promote the film-forming reactions on the surface of the substrate.

The gases in the film forming chamber are exhausted through a valve 214 by an exhaust pump (not shown), so that the pressure in the film forming chamber is kept at a prescribed level.

Explanation will be made on an example for the preparation of the ZnSe:H film using the apparatus shown in FIG. 2.

At first, Se-containing raw material gas (B) such as DESe and hydrogen gas are fed through the gas inlet pipe 209. The gases are activated in the activation region 210 with the action of activation energy supplied by the activating means 211. Thus there are formed an Se-containing precursor and hydrogen radicals in atomic state.

On the other hand, the Zn-containing raw material gas (A) such as DEZn entering through the other gas inlet pipe 208 is introduced into the film forming chamber 201 without being excited by the activating means because the opening of the gas inlet pipe 208 is located downstream being apart from the activation region 210. In the film forming chamber 201, the Zn-containing raw material gas (A) reacts with hydrogen radicals to form a Zn-containing precursor.

Upon introduction into the film-forming chamber, the Se-containing precursor, Zn-containing precursor, and hydrogen radicals react with one another to form a ZnSe:H film containing a desired amount of hydrogen atoms.

It is considered that hydrogen radicals take part also in the reaction for film deposition on the substrate surface. That is, the hydrogen radicals function to remove unnecessary alkyl groups from the deposited film and also to terminate dangling bonds in the ZeSe thin film and they are taken into the film. The activation energy in the activating region can be brought to the film-forming chamber for example by increasing the quantity of the activation energty supplied by the activating means in case where necessary to promote the reaction of the Zn-containing raw material gas with hydrogen radicals and the reaction of the Zn-containing precursor with the Se-containing precursor in the reaction chamber and also to increase the amount of hydrogen radicals to be supplied. The amount of hydrogen atoms (H) to be contained in the ZnSe:H film as obtained can be controlled by properly adjusting the flow rate of hydrogen gas introduced as a raw material gas, the quantity of activation energy to be supplied, the inner pressure in the film-forming chamber, the distance between the activation region 210 and the opening of the gas inlet pipe 208, and the substrate temperature. The deposited film can be made p-type or n-type by adding the above-mentioned dopant raw material to the raw material gas (A) or raw material gas (B).

FIG. 3 schematically shows a preferred example of the apparatus used to practice the process (2) of the present invention. When this apparatus is in operation, raw material gas (A) is introduced through the gas inlet pipe 308, and raw material gas (B) and hydrogen gas are introduced through the gas inlet pipe 309. These gases are eventually mixed and they are reacted while being decomposed, polymerized, radicalized, and ionized in plasma generated by high-frequency power applied to the cathode 312 from the high-frequency source 310 through the matching circuit 311 to thereby form a ZnSe:H thin film on the substrate 303. By feeding the foregoing dopant raw material in the above case, the resulting deposited film may be made p-type or n-type.

FIG. 4 schematically shows a preferred example of the apparatus suitable to practice the process (3) of the present invention. In FIG. 4, there is shown a cathode 412, onto which is attached a target 413 of ZnSe polycrystal. Ar gas and $H_2$ gas are introduced through the gas inlet 408 and they are ionized by plasma generated by high-frequency power applied to the cathode 412. The resulting Ar ions and H ions contribute to sputtering the target 416. Thus a ZnSe:H thin film is deposited on the substrate 403. By mixing the Ar gas and $H_2$ gas with the above-mentioned dopant raw material, the resulting deposited film may be made p-type or n-type.

Now, any of the foregoing Non-Si(H,F) films and Non-Si(C,Ge)(H,F) films to be used for the formation of the i-type semiconductor layer of the pin junction photovoltaic element according to the present invention are well known, there have been already proposed various methods for the preparation of them.

Likewise, any of the foregoing p-type semiconductor films other than the foregoing ZnSe:H:Mp film to be used for the formation of the p-type semiconductor layer and any of the n-type semiconductor films other than the foregoing ZnSe:H:Mn film to be used for the formation of the n-type semiconductor layer are also well known. And desirable examples of such p-type or n-type film are p-typed or n-typed films of the above Non-Si(H,F) or Non-Si(C,Ge)(H,F) films. These p-typed or n-typed films may be easily prepared by doping the above Non-Si(H,F) film or Non-Si(C,Ge)(H,F) film with a dopant of p-type or n-type. Representative examples of the p-type dopant are, for example, Group III elements such as B, Al, Ga and In. Representative examples of the n-type dopant are, for example, Group V elements such as P, As, Sb and Bi.

They may be, however, prepared also in accordance with any of the aforesaid processes (1) to (3) according to the present invention.

That is, (A) A process of forming, for example, a A-SiC:H:F film in accordance with the foregoing process (1) comprises the steps of introducing a C-containing raw material gas and hydrogen gas ($H_2$) into an activation space independent of the film-forming space, applying activation energy to these gases to form C-containing precursor and hydrogen radicals in atomic state; introducing said precursors and hydrogen radicals into the film-forming space; simultaneously introducing a Si and F-containing raw material gas into said film-forming space; and causing said gases to chemically react with each other in the space surrounding the surface of a substrate maintained at elevated temperature in said film-forming space.

In the case of forming a A-SiGe:H:F film in accordance with this process (A), a Ge-containing raw material gas is used in stead of the C-containing raw material gas. Further in the case of forming a A-Si:H:F film or a polySi:H:F film, there are used a Si-containing raw material gas, hydrogen gas ($H_2$) and a F-containing raw material gas.

(B) A process of forming, for example, a A-SiC:H:F film in accordance with the foregoing process (2) comprises the steps of introducing a C-containing raw material gas, hydrogen gas ($H_2$) and a Si and F-containing raw material gas into the film-forming space in which a substrate is arranged; mixing said gases; applying a high-frequency power to a cathode installed in said film-forming space to thereby produce plasmas in the reaction space of the film-forming space; and causing said gases to chemically react with one another through decomposition, polymerization, radicalization, and ionization.

In the case of forming a A-SiGe:H:F film in accordance with this process (B), as well as in the case of the said process (A), there is used a Ge-containing raw material gas in stead of the C-containing raw material gas. Likewise, in the case of forming a A-Si:H:F film or a poly-Si:H:F film, there are used a Si-containing raw material gas, hydrogen gas ($H_2$) and a F-containing raw material gas.

(C) A process of forming, for example, a A-SiC:H:F film in accordance with the foregoing process (3) comprises the steps of introducing an Ar gas, $H_2$ gas, and $F_2$ gas or HF gas into the film-forming space in which a substrate is arranged and a cathode is arranged opposite to said substrate while leaving a certain distance between them, said cathode being provided on the surface thereof with a target of polycrystal SiC; applying a high-frequency power to said cathode to thereby perform the sputtering of said polycrystal SiC and form plasma atmosphere environment in said film-forming space; and causing Si and C in atomic state emitted from the target, and hydrogen and fluorine in atomic state formed by the plasma exitation of the $H_2$ gas, and the $F_2$ gas or HF gas to chemically react with one another in the space surrounding the surface of the substrate.

In the case of forming a A-SiGe:H:F film, a A-Si:H:F film or a poly-Si:H:F film, there is used a polycrystal SiGe target or a polycrystal Si target in stead of the polycrystal SiC target.

The above-mentioned process (A), (B) or (C) may be practiced in the following manner to prepare a p-typed or n-typed film of any of the above films. That is, a gaseous raw material to provide a p-type dopant or n-type dopant ("p-type dopant raw material" or "n-type dopant raw material" for short) is introduced, alone, or together with the gaseous film-forming raw material or together with $H_2$ gas.

The above-mentioned processes (A) to (C) of the present invention will be described in more detail in the following.

Processes (A) and (B)

As the raw material to introduce Si ("raw material I" for short), a gaseous or easily gasifiable silicon halide or silicon hydride is used. Typical examples of such compound include $SiF_4$, $Si_2F_6$, $SiH_4$, $Si_2H_6$, $SiH_2F_2$ and the like.

Among these compounds, those which are not gaseous but liquid or solid at room temperature are gasified at the time of their use by bubbling with an inert carrier gas such as Ar and He, or by sublimation with heating.

As the raw material to introduce C ("raw material II" for short) in the case of forming, for example, a A-SiC series film or a poly-SiC series film, a gaseous or easily gasifiable hydrocarbon compound or carbon halide compound is used. Typical examples of such compound include $CH_4$, $C_2H_2$, $C_2H_6$, $C_3H_8$, $CH_2F_2$ and the like.

Among these compounds, those which are not gaseous but liquid or solid at room temperature are gasified at the time of their use by bubbling with an inert carrier gas such as Ar and He, or by sublimation with heating.

As the raw material to introduce Ge ("raw material II" for short) in the case of forming, for example, a A-SiGe series film, a gaseous or easily gasifiable germanium-containing compound is used. Typical examples of such compound include $GeH_4$, $GeF_4$ and the like.

Among these compounds, those which are not gaseous but liquid or solid at room temperature are gasified at the time of their use by bubbling with an inert carrier gas such as Ar and He, or by sublimation with heating.

In order to prepare a non-single crystal film containing at least silicon atoms and hydrogen atoms in accordance with the foregoing process (A) or (B), $H_2$ gas is purposely used.

In a preferred embodiment of the foregoing process (A) to prepare a non-single crystal film containing silicon atoms, carbon atoms and at least hydrogen atoms or a non-single crystal film containing silicon atoms, germanium atoms and at least hydrogen atoms, the gaseous raw material II [that is the raw material B in the case of the foregoing process (1)] and $H_2$ gas in combination are introduced into an activation space, where they are excited with the action of an activation energy to form active species. In the case of using non-gaseous raw material II, the activation space may be constructed such that the non-gaseous raw material II is gasified by the aid of aforesaid inert gas or $H_2$ gas, and the gas thus formed is excited with the action of an activation energy as well as in the case of the foregoing process (1).

Needless to say, in the process (A), it is possible to introduce $H_2$ gas alone into a separate activation space independent of said activation space, where the $H_2$ gas is excited with the action of an activation energy.

The above activation energy may be discharge energy, thermal energy, or light energy, or a combination thereof.

The excitation of the raw material II may be accomplished by the aid of a proper catalyst as well as the activation energy.

As above mentioned, it is possible to make the resulting film in the above process (A) or (B) to be of p-type or of n-type by introducing a p-type dopant raw material or a n-type dopant raw material into the film-forming space.

Typical examples of such p-type dopant raw material include gaseous or easily gasifiable compounds such as $AsH_3$, $PH_3$, $P_2H_4$, $AsF_3$, $AsCl_3$, $PF_5$, $PF_3$, $PCl_3$, $SbH_3$, $SbF_3$ and the like.

Typical examples of such n-type dopant raw material include gaseous or easily gasifiable compounds such as $B_2H_6$, $Al(CH_3)_3$, $Al(C_2H_5)_3$, $Ga(CH_3)_3$, $Ga(C_2H_5)_3$, $In(CH_3)_3$, $In(C_2H_5)_3$ and the like.

In the case where the p-type or n-type dopant raw material is liquid at room temperature, it is gasified at the time of use by bubbling with an inert gas such as Ar or He or $H_2$ gas as a carrier gas. In the case where the p-type or n-type dopant raw material is solid at room temperature, it is gasified at the time of use by sublimation with heating by the aid of a carrier gas such as Ar and He in a sublimation furnace.

In the case where a p-type or n-type non-single crystal film containing at least silicon atoms and hydrogen atoms in accordance with the foregoing process (A), it is effective when the dopant raw material is introduced into the activation space together with the gaseous raw material II and $H_2$ gas.

In order to prepare a Non-Si(H,F) film, a Non-Si(C,Ge) film, a p-typed Non-Si(H,F) film, a p-typed Non-Si(C,Ge)(H,F) film, an n-typed Non-Si(H,F) film or an n-typed Non-Si(C,Ge)(H,F) film in accordance with the foregoing process (A) or (B), the substrate is maintained preferably at a temperature of 50° to 600° C., more preferably at a temperature of 50° to 500° C., and most preferably, at a temperature of 100° to 400° C. during the film formation process.

As for the inner pressure of the film-forming space, it is preferably from $1 \times 10^{-4}$ to 50 Torr, more preferably from $5 \times 10^{-3}$ to 10 Torr, and most preferably, from $1 \times 10^{-3}$ to 5 Torr.

In practice of this respect, the gaseous raw material I, the gaseous raw material II, hydrogen gas ($H_2$), and the gaseous dopant (p-type or n-type) raw material when it is used, are introduced while being controlled through respective mass flow controllers at respective flow rates predetermined upon the kind of the semiconductor film to be prepared and while maintaining the inner pressure of the film-forming space at a value in the above range.

In the case of the process (A), the gaseous raw material I and the gaseous raw material II and the hydrogen radicals in atomic state are introduced into the film-forming space at a predetermined ratio.

Likewise, in the case of the process (B), the ratio of the sum of the flow rate for the gaseous raw material I and the flow rate for the gaseous raw material II versus the flow rate for the hydrogen gas ($H_2$) is properly determined.

Process (C)

In accordance with this process, there may be prepared any of the foregoing Non-Si(H,F) film, Non-Si(C,Ge)(H,F) film, p-typed Non-Si(H,F) film, p-typed Non-Si(C,Ge)(H,F) film, n-typed Non-Si(H,F) film and n-typed Non-Si(C,Ge)(H,F) film.

For instance, in the case of forming a A-SiC:H:F film, there is usually used a polycrystal SiC as the target. However, it is possible to use two targets of Si and C.

In the case where the sputtering is performed by the application of hig-frequency power to the target, it is preferable to form a gas atmosphere composed of $H_2$ gas and Ar gas and/or He gas.

In the case of forming a p-typed or n-typed A-SiC:H:F film in accordance with the process (C), the above sputtering is performed in a gas atmosphere composed of $H_2$ gas and Ar gas and/or He gas and also the foregoing gaseous p-type or n-type dopant raw material.

In the formation of a A-SiC:H:F film, a p-typed or n-typed A-SiC:H:F film for example, in accordance with the process (C), the important film-forming conditions include the target-to-substrate distance; the high-frequency power, the substrate temperature, the inner pressure, and the gas flow rate. The target-to-substrate distance may vary depending on the construction and scale of the equipment used. In general, it is preferably from 20 to 100 mm, and more preferably, from 40 to 80 mm. The high-frequency power may vary depending upon the type and size of the target In general, it is preferably from 0.3 to 7 W/cm$^2$, and most preferably, from 0.8 to 4 W/cm$^2$. As for the substrate temperature, it is adjusted to the same range as in the above-mentioned process (A) or (B). As for the inner pressure at the time of forming the film, it is preferably from $1 \times 10^{-5}$ to $1 \times 10^{-1}$ Torr, and more preferably, from $1 \times 10^{-4}$ to $1 \times 10^{-2}$ Torr. The $H_2$ gas, $F_2$ gas or HF gas, and Ar gas and/or He gas and the gaseous p-type or n-type dopant raw material are properly controlled in relation to the amounts of Si and C in atomic state which are emitted from the target during the sputtering. The respective flow rates of the above gases are controlled by mass flow controllers such that the gas atmosphere in the reaction zone of the film-forming space contains a prescribed amount of hydrogen atoms (H) or a prescribed sum amount of hydrogen atoms (H), fluorine atoms (F) and dopant (M) [or (H+F+M)]. In this case, the film-forming space is evacuated such that the above-mentioned inner pressure is maintained.

The aforesaid process (A) may be effectively practiced using the apparatus shown in FIG. 2 in the same way as above described with respect to the foregoing process (1). The aforesaid process (B) may be effectively practiced using the apparatus shown in FIG. 3 in the same way as above described with respect to the foregoing process (2). And, the aforesaid process (C) may be effectively practiced using the apparatus shown in FIG. 4 in the same way as described with respect to the foregoing process (3).

DESCRIPTION OF THE PREFERRED EMBODIMENTS

The photovoltaic element of the present invention will be described in more detail with reference to the following examples, which are not intended to restrict the scope of the invention.

EXAMPLE 1

A pin junction photovoltic element with the configuration shown in FIG. 1(A) was prepared using the film-forming apparatus shown in FIG. 2, in accordance with the abovementioned process (1) (Hereinafter referred to as "preparation method 1").

At first, a stainless steel substrate 101 of 50 mm by 50 mm in size was placed in a known sputtering apparatus (not shown). The sputtering apparatus was evacuated to $10^{-5}$ Torr or below. On the substrate was deposited an Ag film of about 1000 Å in thickness as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the gate valve 207 was opened and the substrate transfer unit 206 was moved to the film-forming chamber 201.

The substrate was then heated to about 200° C. by actuating electric heater 205. After the substrate temperature became stable at 200° C., the three kinds of gases categorized in the raw material gas (A) of Table 4 and the two kinds of gases categorized in the raw material gas (B) of Table 4 i.e. the raw material gas (A): SiF$_4$ gas from the gas reservoir 236, Ar gas from the gas reservoir 234 and PH$_3$H$_2$ gas (=1%) from the reservoir 235, and the raw material gas (B): H$_2$ gas from the reservoir 216 and Ar gas from the reservoir 217 were introduced into the film-forming chamber while their respective flow rates being controlled to those values mentioned in Table 4 by means of mass flow controllers 218, 237, 238, 239 and 240. In this case, the raw material gas (A) was fed through the inlet pipe 208 and the raw material gas (B) was fed through the inlet pipe 209.

In FIG. 2, 241 through 248 denote respectively a gas passage selection valve.

Then, with the exhaust valve 214 properly regulated, the inner pressure of the film-forming chamber 201 was maintained at about 0.5 Torr. Film-forming was started by applying microwave power of 300 W from the microwave power generator 211 (2.45 GHz) into the activation region 210. After 3 minutes, there was formed an n-type A-Si:H:F:P film to be the n-type semiconductor layer 102. The application of said microwave power and the introduction of said gases were suspended, and the film-forming chamber 201 was evacuated to about $10^{-5}$ Torr by means of the vacuum pump 215.

Then, the above procedures were repeated for 30 minutes, except that there was not used the PH$_3$/H$_2$ gas, to thereby form an i-type A-Si:H:F film to be the i-type semiconductor layer 104 on the previously formed n-type semiconductor layer 103.

The application of the microwave power and the introduction of the gases were suspended, and the film-forming chamber 201 was evacuated to about $10^{-5}$ Torr by means of the vacuum pump 215.

Successively, there was formed a p-type ZnSe:H:Mp film (Mp=Li) to be the p-type semiconductor layer 105 on the previously formed i-type semiconductor layer 104 in the following. Liquid DESe in Dewar's bottle 222 was gasified by bubbling it with Ar gas from the gas reservoir 217 to generate Ar gas saturated with DESe. At that time, said Ar gas was fed into said liquid DESe in Dewar's bottle 222 while its flow rate being controlled to 15 SCCM by regulating the mass flow controller 219. The resulting Ar gas saturated with DESe was successively introduced through the amount of the DESe to be introduced was controlled to $1.5 \times 10^{-5}$ mol/min. At the same time, H$_2$ gas from the gas reservoir 216 was introduced through the inlet pipe 209 into the film-forming chamber 201 while its flow rate being controlled to 15 SCCM by regulating the mass flow controller 218. Concurrently, DEZn in Dewar's bottle 223 and LiC$_3$H$_7$ in Dewar's bottle 224 were introduced through the inlet pipe 208 into the film-forming chamber 201 at respective flow rate of $1.0 \times 10^{-6}$ mol/min. and $1.0 \times 10^{-9}$ mol/min. in the same manner as in the case of said DESe. At that time, the flow rate of Ar gas as the carrier gas was controlled to 5 SCCM.

In the above, the above respective flow rates for said DESe, DEZn and LiC$_3$H$_7$ were set up respectively by controlling the respective temperatures of constant temperature waters contained in constant temperature water baths 225, 226 and 227 in which the Dewar's bottles 222, 223 and 224 being placed, by means of electric heaters 231, 232 and 233 in said water baths 225, 226 and 227 to thereby adjust the respective temperatures of the starting raw liquids for said DESe, DEZn and LiC$_3$H$_7$ to desired temperatures.

The above film-forming conditions were as shown in Table 5.

With the exhaust valve 214 properly opened, the inner pressure of the film-forming chamber 201 was maintained at about 0.5 Torr. Film-forming was started by applying microwave power (400 W) from the microwave generator 211. After 20 minutes, there was formed the aforesaid ZnSe:H:Li film.

Thereafter, the substrate transfer unit 206 was moved to the load lock chamber 212 through the gate valve 207. After cooling therein, the substrate 101 on which were deposited the n-type, i-type and p-type semiconductor layers was taken out. Then, the substrate was placed in a known vacuum deposition apparatus, which was evacuated to $10^{-5}$ Torr or below. On the foregoing p-type ZnSe:H:Li semiconductor layer 105 on the substrate 101 was deposited an ITO thin film of about 700 Å in thickness in an oxygen atmosphere with about $1\times10^{-3}$ Torr. The source of deposition was a 1:1 (by weight) mixture of In and Sn placed in a crucible which was heated by the resistance heating method. The substrate temperature was 175° C. In this way, the transparent electrode 106 was formed. After cooling, the substrate was removed. With a permalloy mask placed on the transparent electrode 106, the substrate was placed in another known vacuum deposition apparatus, which was evacuated to $1\times10^{-5}$ Torr or below. A Ag film of about 1.0 μm in thickness was deposited by the resistance heating method to form the comb-shaped collecting electrode 107. Thus there was obtained sample No. 1.

The characteristic properties of Sample No. 1 as a solar cell were evaluated in the following manner.

The open-circuit voltage (Voc) which is produced when the transparent electrode 106 is irradiated with AM-1 light (100 mW/cm$^2$) was measured. The output which is produced when the transparent electrode 106 is irradiated with AM-1 light through a 400-nm interference filter was measured. The change Δη in conversion efficiency that takes place after irradiation with AM-1 light for 10 hours was measured.

The results of measurements were as shown in Table 26.

Other than the foregoing, there were provided a silicon single crystal wafer with a SiO$_2$ film formed thereon by the known thermal oxidation technique and a quartz glass plate. And there were deposited a A-Si:H:F:P film as the aforesaid n-type semiconductive layer, a A-Si:H:F film as the aforesaid i-type semiconductor layer and a ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 2

A pin junction photovoltaic element with the configuration shown in FIG. 1(A) was prepared using the film-forming apparatus shown in FIG. 3, in accordance with the above-mentioned process (2)(hereinafter referred to as "preparation method 2").

On a stainless steel substrate 101 (303 in FIG. 3) was deposited an Ag thin film as the lower electrode 102 in the same manner as in Example 1. The substrate 303 was fixed, with the lower electrode 102 facing downward, onto the substrate holder 302 on the substrate transfer unit 306 installed in the load lock chamber 313. The load lock chamber 313 was evacuated to $10^{-5}$ Torr or below by means of a vacuum pump (not shown). During evacuation, the film-forming chamber 301 was evacuated to $10^{-5}$ Torr or below by means of the vacuum pump 315. When the pressures in the two chambers became almost balanced, the gate valve 307 was opened and the substrate transfer unit 306 was moved into the film-forming chamber 301.

The substrate was then heated to about 300° C. by actuating infrared heater 305. After the substrate temperature became stable, the raw material gas A and the raw material gas B shown in the column "n-type" of Table 6 were introduced respectively through the inlet pipes 308 and 309 into the film-forming chamber 301 under the corresponding feeding conditions shown in Table 6. With the exhaust valve 314 properly opened, the inner pressure of the film-forming chamber 301 was kept at 1.0 Torr. Film-forming was started by applying high-frequency power (30 W) from the high-frequency (13.56 MHz) generator 310. (The high-frequency generator 301 is connected to the cathode 312 through the matching circuit 311.) After discharging for 2 minutes, there was deposited an n-type A-Si:H:F:P film 103. The application of high-frequency power and the introduction of the gases were suspended, and the film-forming chamber 301 was vacuumed to $10^{-5}$ Torr or below. Then, SiH$_2$F$_2$ gas was introduced into the film-forming chamber 301. With the inner pressure being maintained at 1.0 Torr, high-frequency power (20 W) was applied from the high-frequency source 310. After discharging for 30 minutes under the film-forming conditions shown in the column in the column "i-type" of Table 6, there was deposit an i-type A-Si:H:F film 104 on the previously formed n-type A-Si:H:F:P film 103.

Then, the above procedures were repeated, except that there were used the raw material gases A and B shown in the column "p-type" of Table 6 and the respective flow rates of said raw material gases were controlled to those mentioned in the column "p-type" of Table 6, to thereby deposit a p-type ZnSe:H:Li film 105 on the previously formed i-type A-Si:H:F film 104.

The substrate with the deposited films was removed from the film-forming chamber 301. On the deposited p-type film was formed an ITO film of about 700 Å in thickness as the transparent electrode 106 in the same manner as in Example 1. On the ITO film was formed an Ag thin film as the collecting electrode 107. Thus there was obtained Sample No. 2. The characteristic properties of Sample No. 2 as a solar cell were evaluated in the same manner as in Example 1. As a result, there were obtained the results shown in Table 26.

Other than the foregoing, there were provided a silicon single crystal wafer with a SiO$_2$ film formed thereon by the known thermal oxidation technique and a quartz glass plate. And there were deposited an n-type A-Si:H:F:P film as the aforesaid n-type semiconductor layer, an i-type A-Si:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 3

A pin junction photovoltaic element with the configuration shown in FIG. 1(A) was prepared using the apparatus shown in FIG. 4, in accordance with the abovementioned process (3)(hereinafter referred to as "preparation method 3").

On a stainless steel substrate 101 (304 in FIG. 4) was deposited the lower electrode 103 comprising Ag in the same manner as in Example 1. The substrate was fixed onto the substrate holder 402 on the substrate transfer unit 406 in the load lock chamber 413 and transferred into the film-forming chamber 401. The inner pressure in the film-forming chamber 401 was kept at $10^{-5}$ Torr or below. A Si polycrystal target 417 was placed on cathode 412. The substrate was heated to about 200° C. by means of infrared heater 405. The raw material gases shown in the column "n-type" of Table 7 were introduced at the respective flow rates shown therein into the film-forming chamber 401 through the gas inlet pipe 408.

With the exhaust valve 414 properly opened, the inner pressure of the film-forming chamber 401 was kept at 0.05 Torr. Film-forming was started by applying high-frequency power (300 W) from high-frequency power generator 410 onto the cathode 412 through matching circuit 411. After discharging for 3 minutes, there was deposited an n-type A-Si:H:F:P film 103. The discharging and the introduction of the gases were suspended.

The film-forming chamber 401 was vacuumed to $10^{-5}$ Torr or below, and the raw material gases shown in the column "i-type" of Table 7 were introduced at the respective flow rates shown therein into the film-forming chamber. After discharging with a 300 W of high-frequency power and with a vacuum of 0.05 Torr for 60 minutes, there was deposited an i-type A-Si:H:F film 104 on the previously formed n-type A-Si:H:F:P film 103. Then, the substrate 403 was moved into the load lock chamber 413. Thereafter, the above Si polycrystal target on the cathode 412 was replaced by a ZnSe polycrystal target. The substrate 403 was moved into the film-forming chamber 401, and it was kept at 200° C. Thereafter, the raw material gases shown in the column "p-type" of Table 7 were introduced through the inlet pipe 408 into the film-forming chamber 401 at the respective flow rates shown in said Table 7. With the exhaust valve 414 properly opened, the inner pressure of the film-forming chamber 401 was controlled to a vacuum of 0.05 Torr.

After the flow rates of the gases and the inner pressure of the film-forming chamber 401 became stable, a 300 W of high-frequency power was applied onto the cathode 412 in the same manner as in the above case.

After discharging for 3 minutes, there was formed a p-type ZnSe:H:Li film 103 on the previously formed i-type A-Si:H:F film 104. The application of the high-frequency power and the introduction of the gases were terminated. Then, the film-forming chamber 401 was vacuumed to about $10^{-5}$ Torr, and the substrate 403 was moved into the load lock chamber 413. The substrate 403 with the deposited films was taken out from the load lock chamber 413. Then, on the deposited p-type film was formed an ITO film of about 700 Å in thickness as the transparent electrode 106 in the same manner as in Example 1. On the ITO film was formed an Ag thin film as the collecting electrode 107. Thus there was obtained Sample No. 3. The characteristic properties of Sample No. 3 as a solar cell were evaluated in the same manner as in Example 1. As a result, there were obtained the results shown in Table 26.

Other than the foregoing, there were provided a silicon single crystal wafer with a $SiO_2$ film formed thereon by the known thermal oxidation technique and a quartz glass plate. And there were deposited an n-type A-Si:H:F:P film as the aforesaid n-type semiconductor layer, an i-type A-Si:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 4

In the preparation of the pin junction photovoltaic element in any case of Examples 1 to 3, the n-type, i-type and p-type semiconductor layers were all prepared respectively in the same manner utilizing the same film-forming apparatus. However, the manners for forming these layers may be different one from the other.

This example illustrates the preparation of a pin junction photovoltaic element in the case where the formations of the n-type and i-type semiconductor layers were carried out by the manner different from the manner for the formation of the p-type semiconductor layer.

In this example, as the film-forming apparatus, there was used the apparatus shown in FIG. 3 in which the chamber 316 comprises the film-forming chamber 201 shown in FIG. 2.

At first, on a stainless steel substrate 101 (303 in FIG. 3) was deposited an Ag thin film of 3000 Å in thickness as the lower electrode 102. The substrate was fixed onto the substrate holder 302 on the substrate transfer unit 306 in the film-forming chamber 301. On the substrate was deposited an n-type A-Si:H:F:P film 103 by repeating the procedures for the formation of the n-type film in Example 2 and successively, there was formed an i-type A-Si:H:F film 104 on the previously formed n-type A-Si:H:F:P film 103 by repeating the procedures for the formation of the i-type film in Example 2. The film-forming chamber 301 was evacuated to $10^{-5}$ Torr or below, and the substrate transfer unit 306 was moved into the second film-forming chamber 316 through the gate valve 307. Subsequently, on the i-type A-Si:H:F film was deposited a p-type ZnSe:H:Li film 105 by repeating the procedures for the formation of the p-type film in Example 1.

On the thus formed p-type ZnSe:H:Li film 105 were formed a transparent electrode 106 comprising an ITO thin film then a collecting electrode 107 comprising a Ag thin film respectively in the same manner as in Example 1.

Thus there was obtained Sample No. 4.

The characteristic properties of Sample No. 4 as a solar cell were evaluated.

The results obtained were as shown in Table 26.

Other than the foregoing, there were provided a silicon single crystal wafer with a $SiO_2$ film formed thereon by the known thermal oxidation technique and a quartz glass plate. And there were deposited an n-type A-Si:H:F:P film as the aforesaid n-type semiconductor layer, an i-type A-Si:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 5

In this example, there was prepared a pin junction photovoltaic element with the configuration shown in FIG. 1(A) having an n-type semiconductor layer 103 comprising an n-type A-SiGe:H:F:P film, an i-type semiconductor layer 104 comprising a A-SiGe:H:F film and a p-type semiconductor layer 105 comprising a p-type ZnSe:H:Li film (Sample No. 5) in the same manner as in Example 1.

That is, on a stainless steel substrate 101 was formed an Ag thin film as the lower electrode 102 in the same manner as in Example 1. Then, there was formed said n-type A-SiGe:H:F:P film in accordance with the manner for the formation of the n-type semiconductor layer in Example 1 and under the film-forming conditions mentioned in the column "n-type" of Table 8. Then, there was formed said i-type A-SiGe:H:F film in accordance with the manner for the formation of the i-type semiconductor layer in Example 1 and under the film forming conditions mentioned in the column "i-type" of Table 8. On the thus formed i-type A-SiGe:H:F film was formed said p-type ZnSe:H:Li film by repeating the procedures for the formation of the p-type semiconductor layer in Example 1.

Then, there were successively formed a ITO thin film as the transparent electrode 106 and a comb-shaped Ag thin film as the collecting electrode 107 respectively in the same manner as in Example 1.

In this way, there was obtained a pin junction photovoltaic element sample No. 5.

The characteristic properties of this sample as a solar cell were evaluated in the same evaluation manner as in Example 1.

The results obtained were as shown in Table 26.

Other than the foregoing, there were provided a silicon single crystal wafer with a $SiO_2$ film formed thereon by the known thermal oxidation technique and a quartz glass plate. And there were deposited an n-type A-SiGe:H:F:P film as the aforesaid n-type semiconductor layer, an i-type A-SiGe:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 6

In this example, the procedures of Example 5 for the formations of the Ag thin film as the lower electrode 102 on a stainless steel substrate 101, the n-type A-SiGe:H:F:P film as the n-type semiconductor layer 103 and the i-type A-SiGe:H:F film as the i-type semiconductor layer 104 were repeated. Then, the procedures of Example 2 for the formation of the p-type ZnSe:H:Li film as the p-type semiconductor layer 105 were repeated.

Thereafter, there were successively formed a ITO thin film as the transparent electrode 106 and a comb-shaped Ag thin film as the collecting electrode 107 respectively in the same manner as in Example 1.

In this way, there was prepared a pin junction photovoltaic element with the configuration shown in FIG. 1(A) having an n-type semiconductor layer 103 comprising an n-type A-SiGe:H:F:P film, an i-type semiconductor layer 104 comprising a A-SiGe:H:F film and a p-type semiconductor layer 105 comprising a p-type ZnSe:H:Li film (Sample No. 6).

The characteristic properties of this Sample No. 6 as a solar cell were evaluated in the same evaluation manner as in Example 1.

The results obtained were as shown in Table 26.

Other than the foregoing, there were provided a silicon single crystal wafer with a $SiO_2$ film formed thereon by the known thermal oxidation technique and a quartz glass plate. And there were deposited an n-type A-SiGe:H:F:P film as the aforesaid n-type semiconductor layer, an i-type A-SiGe:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 7

In this example, the procedures of Example 5 for the formations of the Ag thin film as the lower electrode 102 on a stainless steel substrate 101, the n-type A-SiGe:H:F:P film as the n-type semiconductor layer 103 and the i-type A-SiGe:H:F film as the i-type semiconductor layer 104 were repeated. Then, the procedures of Example 3 for the formation of the p-type ZnSe:H:Li film as the p-type semiconductor layer 105 were repeated.

Thereafter, there were successively formed a ITO thin film as the transparent electrode 106 and a comb-shaped Ag thin film as the collecting electrode 107 respectively in the same manner as in Example 1.

In this way, there was prepared a pin junction photovoltaic element with the configuration shown in FIG. 1(A) having an n-type semiconductor layer 103 comprising an n-type A-SiGe:H:F:P film, an i-type semiconductor layer 104 comprising a A-SiGe:H:F film and a p-type semiconductor layer 105 comprising a p-type ZnSe:H:Li film (Sample No. 7).

The characteristic properties of this Sample No. 7 as a solar cell were evaluated in the same evaluation manner as in Example 1.

The results obtained were as shown in Table 26.

Other than the foregoing, there were provided a silicon single crystal wafer with a $SiO_2$ film formed thereon by the known thermal oxidation technique and a quartz glass plate. And there were deposited an n-type A-SiGe:H:F:P film as the aforesaid n-type semiconductor layer, an i-type A-SiGe:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 8

There was prepared a pin junction photovoltaic element with the configuration shown in FIG. 1(A) having an n-type semiconductor layer 103 comprising an n-type A-SiGe:H:F:P film, an i-type semiconductor layer 104 comprising an i-type A-SiGe:H:F film and a p-type semiconductor layer 105 comprising a p-type ZnSe:H:Li film (Sample No. 8).

On a stainless steel substrate 101 was formed an Ag thin film as the lower electrode 102 in the same manner as in Example 1.

Then, there were formed said n-type A-SiGe:H:F:P film and successively, said i-type A-SiGe:H:F film by repeating the procedures of Example 2 with the use of the film-forming apparatus shown in FIG. 3 for the formations of the n-type semiconductor layer and the i-type semiconductor layer under the film-forming conditions shown in 9. Therafter, in the same manner as in Example 1 for the formation of the p-type semiconductor layer, there was formed said p-type ZnSe:H:Li film on the previously formed i-type A-SiGe:H:F film.

Then, there were successively formed a ITO thin film as the transparent electrode 106 and a comb-shaped Ag thin film as the collecting electrode 107 respectively in the same manner as in Example 1.

In this way, there was obtained a pin junction photovoltaic element sample No. 8.

The characteristic properties of this sample as a solar cell were evaluated in the same evaluation manner as in Example 1.

The results obtained were as shown in Table 26.

Other than the foregoing, there were provided a silicon single crystal wafer with a SiO$_2$ film formed thereon by the known thermal oxidation technique and a quartz glass plate. And there were deposited an n-type A-SiGe:H:F:P film as the aforesaid n-type semiconductor layer, an i-type A-SiGe:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 26.

EXAMPLE 9

In this example, there were prepared four pin junction photovoltaic elements respectively with the configuration shown in FIG. 1(A), respectively having an n-type semiconductor layer 103 comprising an n-type A-Si:H:F:P film, an i-type semiconductor layer 104 comprising an i-type A-SiC:H:F film and a p-type semiconductor layer 105 comprising a p-type ZnSe:H:Li film (Sample Nos. 9 to 12) as shown Table 27.

In the preparation of each sample, there was used a stainless steel of 50 mm $\times$ 50 mm in size as the substrate 101, and on which was formed a Ag thin film as the lower electrode 102 in the same manner as in Example 1.

Thereafter, there were successively formed said n-type A-Si:H:F:P film, said i-type A-SiC:H:F film and said p-type ZnSe:H:Li film.

The n-type A-Si:H:F:P film was formed in accordance with the preparation method 1 (Example 1), the preparation method 2 (Example 2) or the preparation method 3 (Example 3) respectively for the formation of the n-type semiconductor layer.

The i-type A-SiC:HG:F film was formed in accordance with the preparation method 1 (Example 1), the preparation method 2 (Example 2) or the preparation method 3 (Example 3) respectively for the formation of the i-type semiconductor layer and under the corresponding the film-forming conditions shown in Table 10.

The p-type ZnSe:H:Li film was formed in accordance with the preparation method 1 (Example 1), the preparation method 2 (Example 2) or the preparation method 3 (Example 3) respectively for the formation of the p-type semiconductor layer.

Then, in each case, there were successively formed a ITO thin film as the transparent electrode 106 and a comb-shaped Ag thin film as the collecting electrode 107 respectively in the same manner as in Example 1.

In this way, there were obtained four pin junction photovoltaic elements (Sample Nos. 9 to 12).

The characteristic properties of each sample as a solar cell were evaluated in the same evaluation manner as in Example 1.

The results obtained were as shown in Table 27.

Other than the foregoing, for each case, there were provided a silicon single crystal wafer with a SiO$_2$ film formed thereon by the known thermal oxidation technique and a quartz glass plate. And there were deposited an n-type A-Si:H:F:P film as the aforesaid n-type semiconductor layer, an i-type A-Si:H:F film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 27.

EXAMPLE 10

In this example, there were prepared four pin junction photovoltaic elements respectively with the configuration shown in FIG. 1(A), respectively having an n-type semiconductor layer 103 comprising an n-type A-Si:H:F:P film, an i-type semiconductor layer 104 comprising an i-type poly-Si(H,F) film and a p-type semiconductor layer 105 comprising a p-type ZnSe:H:Li film (Sample Nos. 13 to 16) as shown Table 28.

In the preparation of each sample, there was used a stainless steel of 50 mm $\times$ 50 mm in size as the substrate 101, and on which was formed a Ag thin film as the the lower electrode 102 in the same manner as in Example 1.

Thereafter, there were successively formed said n-type A-Si:H:F:P film, said i-type poly-Si(H,F) film and said p-type ZnSe:H:Li film.

The n-type A-Si:H:F:P film was formed in accordance with the preparation method 1 (Example 1), the preparation method 2 (Example 2) or the preparation method 3 (Example 3) respectively for the formation of the n-type semiconductor layer.

The i-type poly-Si(H,F) film was formed in accordance with the preparation method 1 (Example 1), the preparation method 2 (Example 2) or the preparation method 3 (Example 3) respectively for the formation of the i-type semiconductor layer and under the corresponding the film-forming conditions shown in Table 11.

The p-type ZnSe:H:Li film was formed in accordance with the preparation method 1 (Example 1), the preparation method 2 (Example 2) or the preparation method 3 (Example 3) respectively for the formation of the p-type semiconductor layer.

Then, in each case, there were successively formed a ITO thin film as the transparent electrode 106 and a comb-shaped Ag thin film as the collecting electrode 107 respectively in the same manner as in Example 1.

In this way, there were obtained four pin junction photovoltaic elements (Sample Nos. 13 to 16).

The characteristic properties of each sample as a solar cell were evaluated in the same evaluation manner as in Example 1.

The results obtained were as shown in Table 28.

Other than the foregoing, for each case, there were provided a silicon single crystal wafer with a SiO$_2$ film formed thereon by the known thermal oxidation technique and a quartz glass plate. And there were deposited an n-type A-Si:H:F:P film as the aforesaid n-type semiconductor layer, an i-type poly-Si(H,F) film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 28.

EXAMPLE 11

In this example, there were prepared four pin junction photovoltaic elements respectively with the configuration shown in FIG. 1(B), having a p-type semiconductor layer 105 comprising a ZnSe:H:Li film, an i-type semiconductor layer 104 comprising a member selected from the group consisting of a A-Si:H film, a A-SiGe:H film, a A-SiC:H film and a poly-Si:H:F and an n-type semiconductor layer 104 comprising a member selected from the group consisting of a A-Si:H:F:P film and a A-SiGe:H:F:P film (Sample Nos. 17 to 20).

In the preparation of each sample, there was used a glass plate (Corning's glass No. 7059, product of Corning Glass Works, U.S.A.) of 50 mm × 50 mm in size as the substrate 101, and on which was formed a ITO thin film of 500 Å in thickness as the transparent electrode 106 in accordance with the known reactive sputtering method. Thereafter there was formed said a p-type ZnSe:H:Li film as the p-type semiconductor layer 105 by repeating the procedures for the formation of the p-type ZnSe:H:Li film in Example 1.

Successively, there was formed any of the abovementioned i-type films as the i-type semiconductor layer 104 in accordance with the corresponding method shown in Table 12. Then, there was formed any of the abovementioned n-type films as the n-type semiconductor layer 103 in accordance with the corresponding method shown in Table 12.

Thereafter, there was formed a Al thin film of about 500 Å in thickness as the electrode 102 in accordance with the known resistance heating deposition method.

In this way, there were obtained photovoltaic element samples Nos. 17 to 20.

The characteristic properties of each of these samples as a solar cell were evaluated in the same evaluation manner as in Example 1.

The results obtained were as shown in Table 29.

Other than the foregoing, there were provided a silicon single crystal wafer with a SiO$_2$ film formed thereon by the known thermal oxidation technique, and a quartz glass plate. And on the surface of each of them, there was deposited a film of each constituent layer for each photovoltaic element sample by repeating the corresponding procedures for the formation thereof.

The resultant deposited films were examined for the content of hydrogen atoms (H) and the proportion of crystal grain domains per unit volume in accordance with the procedures of examining them, which were employed in the foregoing Experiments.

The results obtained were as shown in Table 29.

EXAMPLE 12

In this example, there was prepared a pin junction photovoltaic element with the configuration shown in FIG. 1(A), having an n-type semiconductor layer 103 comprising an n-type ZnSe:H:Al film, an i-type semiconductor layer 104 comprising a A-Si:H:F film and a p-type semiconductor layer 105 comprising a p-type ZnSe:H:Li film by repeating the procedures of Example 1, except that said n-type ZnSe:H:Al film was formed by using the raw material gas A and the raw material gas B shown in Table 13 and introducing them into the film-forming chamber 201 at the respective flow rates shown in Table 13.

The characteristic properties of the thus obtained pin junction photovoltaic element sample (Sample No. 21) as a solar cell were evaluated in the same evaluation manner as in Example 1.

The results obtained were as shown in Table 29. Other than the foregoing, the content of hydrogen atoms and the proportion crystal grain domains for each of the above constituent films were examined in the same way as in Example 1.

The results obtained were as shown in Table 29.

EXAMPLE 13

In this example, using the film-forming apparatuses shown in FIGS. 2, 3 and 4, there was prepared a triple-cells stacked pin junction photovoltaic element with the configuration shown in FIG. 1(C)(Sample No. 22) comprising a first cell unit, a second cell unit and a third cell unit being stacked in this order from the side of a substrate 101: said first cell unit comprises an n-type semiconductor layer 103-1 comprising an n-type A-SiGe:H:F:P film, an i-type semiconductor layer 104-1 comprising an i-type A-SiGe:H:F film and a p-type semiconductor layer 105-1 comprising a p-type ZnSe:H:Li film being stacked in this order: said second cell unit comprises an n-type semiconductor layer 103-2 comprising an n-type A-Si:H:F:P film, an i-type semiconductor layer 104-2 comprising an i-type A-Si:H:F film and a p-type semiconductor layer 105-2 comprising a p-type ZnSe:H:Li film being stacked in this order: and said third cell unit comprises an n-type semiconductor layer 103-3 comprising an n-type A-Si:H:F:P film, an i-type semiconductor layer 104-3 comprising an i-type A-SiC:H:F film, and a p-type semiconductor layer 105-3 comprising a p-type ZnSe:H:Li film being stacked in this order.

In the preparation of the above element, there was provided a stainless steel plate of 50 mm by 50 mm in size as the substrate 101. On the substrate 101 was formed an Ag thin film of about 3000 Å in thickness as the lower electrode 102.

Then, the procedures of Example 5 were repeated, except that the film-forming period to form said i-type A-SiGe:H:F film as the i-type semiconductor layer 104-1 was properly adjusted so as to make its layer thickness to be 3000 Å, to thereby prepare said first cell unit. Successively, the procedures of Example 1 were repeated, except that the film-forming period to form said i-type A-Si:H:F film as the i-type semiconductor layer 104-2 was properly adjusted so as to make its layer thickness to be 4000 Å, to thereby prepare said second cell unit. Thereafter, the procedures of Example 9 were repeated, except that the film-forming period to form said i-type A-SiC:H:F film as the i-type semiconductor layer 104-3 was properly adjusted so as to make its thickness to be 1000 Å, to thereby prepare said third cell unit.

Then, there were successively formed a ITO thin film as the transparent electrode 106 and a comb-shaped Ag thin film as the collecting electrode 107 respectively in the same manner as in Example 1.

In this way, there was obtained a triple-cells stacked pin junction photovoltaic element (Sample No. 22).

The characteristic properties of this sample as a solar cell were examined. The results obtained were as shown in Table 30.

EXAMPLE 14

A pin junction photovoltaic element sample with the configuration shown in FIG. 1(A) was prepared by repeating the procedures of Example 1, except that the formation of the n-type semiconductor layer 103 was carried out by the sputtering method using the apparatus shown in FIG. 4 under the conditions shown in Table 14 to thereby form an n-type ZnSe:Ga film to be the n-type semiconductor layer 103.

The characteristic properties of the thus prepared sample as a solar cell were evaluated. The results obtained were as shown in Table 32.

EXAMPLE 15

A pin junction photovoltaic element sample with the configuration shown in FIG. 1(A) was prepared by repeating the procedures of Example 1, except that the formation of the n-type semiconductor layer 103 was carried by the plasma CVD method using the apparatus shown in FIG. 3 under the conditions shown in Table 15 to thereby form an n-type A-SiGe:H:F:P film to be the n-type semiconductor layer 103.

The characteristic properties of the thus prepared sample as a solar cell were evaluated. The results obtained were as shown in Table 32.

EXAMPLE 16

A pin junction photovoltaic element sample with the configuration shown in FIG. 1(A) was prepared by repeating the procedures of Example 1, except that the formation of the n-type semiconductor layer 103 was carried by the plasma CVD method using the apparatus shown in FIG. 3 under the conditions shown in Table 16 to thereby form an n-type A-SiC:H:F:P film to be the n-type semiconductor layer 103.

The characteristic properties of the thus prepared sample as a solar cell were evaluated. The results obtained were as shown in Table 32.

EXAMPLE 17

A pin junction photovoltaic element sample with the configuration shown in FIG. 1(A) was prepared by repeating the procedures of Example 1, except that the formation of the n-type semiconductor layer 103 was carried out by the sputtering method using the apparatus shown in FIG. 4 under the conditions shown in Table 17 to thereby form an n-type GaAs:Si film to be the n-type semiconductor layer 103.

The characteristic properties of the thus prepared sample as a solar cell were evaluated. The results obtained were as shown in Table 32.

EXAMPLE 18

A pin junction photovoltaic element sample with the configuration shown in FIG. 1(A) was prepared in the same manner as in Example 12, except that the formation of the i-type semiconductor layer was carried out by the plasma CVD method using the apparatus shown in FIG. 3 under the conditions shown in Table 18 to thereby form a A-Si:H film to be the i-type semiconductor layer 104.

The characteristic properties of the thus prepared sample as a solar cell were evaluated. The results obtained were as shown in Table 32.

EXAMPLE 19

A pin junction photovoltaic element sample with the configuration shown in FIG. 1(A) was prepared in the same manner as in Example 12, except that the formation of the i-type semiconductor layer was carried out by the plasma CVD method using the apparatus shown in FIG. 3 under the conditions shown in Table 19 to thereby form a A-SiGe:H film to be the i-type semiconductor layer 104.

The characteristic properties of the thus prepared sample as a solar cell were evaluated. The results obtained were as shown in Table 32.

EXAMPLE 20

A pin junction photovoltaic element sample with the configuration shown in FIG. 1(A) was prepared in the same manner as in Example 12, except that the formation of the i-type semiconductor layer was carried out by the plasma CVD method using the apparatus shown in FIG. 3 under the conditions shown in Table 20 to thereby form a A-SiC:H film to be the i-type semiconductor layer 104.

The characteristic properties of the thus prepared sample as a solar cell were evaluated. The results obtained were as shown in Table 32.

EXAMPLE 21

A pin junction photovoltaic element sample with the configuration shown in FIG. 1(A) was prepared in the same manner as in Example 12, except that the formation of the i-type semiconductor layer was carried out by the sputtering method using the apparatus shown in FIG. 4 under the conditions shown in Table 21 to thereby form a A-Si:F film to be the i-type semiconductor layer 104.

The characteristic properties of the thus prepared sample as a solar cell were evaluated. The results obtained were as shown in Table 32.

EXAMPLE 22

A pin junction photovoltaic element sample with the configuration shown in FIG. 1(A) was prepared in the same manner as in Example 12, except that the formation of the i-type semiconductor layer was carried out by the plasma CVD method using the apparatus shown in FIG. 3 under the conditions shown in Table 22 to thereby form a A-SiGe:C:H film to be the i-type semiconductor layer 104.

The characteristic properties of the thus prepared sample as a solar cell were evaluated. The results obtained were as shown in Table 32.

EXAMPLE 23

A pin junction photovoltaic element sample with the configuration shown in FIG. 1(A) was prepared in the same manner as in Example 12, except that the formation of the i-type semiconductor layer was carried out by the sputtering method using the apparatus shown in FIG. 4 under the conditions shown in Table 23 to thereby form a poly-Si:H film to be the i-type semiconductor layer 104.

The characteristic properties of the thus prepared sample as a solar cell were evaluated. The results obtained were as shown in Table 32.

EXAMPLE 24

There was prepared a pin junction photovoltaic element sample with the configuration shown in FIG. 1(A) having an n-type semiconductor layer 103 comprising a ZnSe:H:Al film, an i-type semiconductor layer 104 comprising a A-Si:H:F film and a p-type semiconductor layer 105 comprising a A-Si:H:F:B film. The procedures of Example 12 were repeated to thereby form the lower electrode 102, the n-type semiconductor layer 103 and the i-type semiconductor layer 104. Then, the formation of the p-type semiconductor layer 105 was carried out by repeating the procedures for the except that there was fed $BF_3/H_2$ gas (=3000 ppm) at a flow rate of 40 SCCM in stead of the $PH_3$ gas. The formation of the transparent electrode 106 and that of the collecting electrode were carried out respectively in the same manner as in Example 1.

The characteristic properties of the thus prepared sample as a solar cell were evaluated. The results obtained were as shown in Table 33.

EXAMPLE 25

There was prepared a pin junction photovoltaic element sample with the configuration shown in FIG. 1(A) having an n-type semiconductor layer 103 comprising a ZnSe:H:Al film, an i-type semiconductor layer 104 comprising a A-Si:H:F film and a p-type semiconductor layer 105 comprising a A-SiC:H:F:B film. The procedures of Example 12 were repeated to thereby form the lower electrode 102, the n-type semiconductor layer 103 and the i-type semiconductor layer 104. Then, the formation of the p-type semiconductor layer 105 was carried out by repeating the procedures for the formation of the n-type semiconductor layer in Example 12, except that there was fed $BF_3/H_2$ gas (=3000 ppm) at a flow rate of 25 SCCM instead of the $PH_3$ gas. The formation of the transparent electrode 106 and that of the collecting electrode were carried out respectively in the same manner as in Example 1.

The characteristic properties of the thus prepared sample as a solar cell were evaluated. The results obtained were as shown in Table 33.

EXAMPLE 26

There was prepared a pin junction photovoltaic element sample with the configuration shown in FIG. 1(A) having an n-type semiconductor layer 103 comprising a ZnSe:H:Al film, an i-type semiconductor layer 104 comprising a A-Si:H:F film and a p-type semiconductor layer 105 comprising a ZnTe:P film. The procedures of Example 12 were repeated to thereby form the lower electrode 102, the n-type semiconductor layer 103 and the i-type semiconductor layer 104. Then, the formation of the p-type semiconductor layer 105 was carried out in accordance with the sputtering method using the apparatus shown in FIG. 4 under the conditions shown in Table 24 to thereby form a ZnTe:P film to be the p-type semiconductor layer. The formation of the transparent electrode 106 and that of the collecting electrode were carried out respectively in the same manner as in Example 1.

The characteristic properties of the thus prepared sample as a solar cell were evaluated. The results obtained were as shown in Table 33.

EXAMPLE 27

There was prepared a pin junction photovoltaic element sample with the configuration shown in FIG. 1(A) having an n-type semiconductor layer 103 comprising a ZnSe:H:Al film, an i-type semiconductor layer 104 comprising a A-Si:H:F film and a p-type semiconductor layer 105 comprising a GaP:Zn film. The procedures of Example 12 were repeated to thereby form the lower electrode 102, the n-type semiconductor layer 103 and the i-type semiconductor layer 104. Then, the formation of the p-type semiconductor layer 105 was carried out in accordance with the sputtering method using the apparatus shown in FIG. 4 under the conditions shown in Table 25 to thereby form a Gap:Zn film to be the p-type semiconductor layer. The formation of the transparent electrode 106 and that of the collecting electrode were carried out respectively in the same manner as in Example 1.

The characteristic properties of the thus prepared sample as a solar cell were evaluated. The results obtained were as shown in Table 33.

COMPARATIVE EXAMPLE 1

In this comparative example, as the standard for comparison, there was prepared a A-Si base pin junction photovoltaic element with the configuration shown in FIG. 1(A) having an n-type semiconductor layer 103 comprising a A-Si:H:F:P film, an i-type semiconductor layer 104 comprising a A-Si:H:F film and a p-type semiconductor layer 105 comprising a A-Si:H:F:B film by repating the procedures of Example 1, except that the said A-Si:H:F:B film for the p-type semiconductor layer was formed in the following with the use of the film-forming apparatus shown in FIG. 2.

That is, the substrate was maintained at about 200° C., SiF$_4$ gas was introduced through the gas inlet pipe 208 into the film-forming chamber 201 at a flow rate of 30 SCCM while said SiF$_4$ gas being mixed with BF$_3$ gas (BF$_3$ being diluted with SiF$_4$ to be 3000 ppm). Concurrently, Ar gas and H$_2$ gas were introduced through the gas inlet pipe 209 into the film-forming chamber 201 at respective flow rates of 250 SCCM and 30 SCCM. With the exhaust valve 214 properly opened, the, inner pressure of the film-forming chamber 201 was maintained at about 0.2 Torr. Film-forming was started by applying microwave power (200 W) into the activation region 210 from the microwave (2.45 GHz) power generator 211. After 3 minutes, there was formed the said A-Si:H:F:B film.

Thus, there was obtained a comparative sample (Sample No. 23). The characteristic properties of Sample No. 23 as a solar cell were evaluated. The results obtained were as shown in Table 31.

COMPARATIVE EXAMPLE 2

In this comparative example, there were prepared two pin junction photovoltaic element comparative samples with the configuration shown in FIG. 1(A)(Sample Nos. 24 and 25).

Sample No. 24 was prepared by repeating the procedures of Example 1, except that there was not used H$_2$ gas at the time of forming the p-type semiconductor layer.

Sample No. 25 was prepared by repeating the procedures of Example 1, except that the flow rate of the H$_2$ gas was changed to 200 SCCM at the time of forming the p-type semiconductor layer. The characteristic properties of each of the two samples as a solar cell were evaluated. The results obtained were as shown in Table 31.

Each of Samples Nos. 24 and 25 was examined for the content of hydrogen atoms (H) and the proportion of crystal grain domains per unit volume in accordance with the procedures of examining them which were employed in the foregoing Experiments.

The results obtained were as shown in Table 31.

COMPARATIVE EXAMPLE 3

In this comparative example, there were prepared two pin junction photovoltaic element comparative samples with the configuration shown in FIG. 1(A)(Sample Nos. 26 and 27).

Sample No. 26 was prepared by repeating the procedures of Example 5, except that there was not used the H$_2$ gas at the time of forming the p-type semiconductor layer.

Sample No. 27 was prepared by repeating the procedures for the preparation of Sample No. 9 in Example 9, except that there was not used the H$_2$ gas at the time of forming the p-type semiconductor layer. The characteristic properties of each of the two samples as a solar cell were evaluated. The results obtained were as shown in Table 31.

Each of Samples Nos. 26 and 27 was examined for the content of hydrogen atoms (H) and the proportion of crystal grain domains per unit volume in accordance with the procedures of examining them which were employed in the foregoing Experiments.

The results obtained were as shown in Table 31.

COMPARATIVE EXAMPLE 4

In this comparative example, there were prepare two pin junction photovoltaic element comparative samples with the configuration shown in FIG. 1(A)(Sample Nos. 28 and 29).

Sample No. 28 was prepared by repeating the procedures of Example 2, except that the i-type semiconductor layer 104 was formed by repeating the procedures for the i-type layer in Example 3 without using the H$_2$ gas and the F$_2$ gas, to thereby form an i-type A-Si film.

Sample No. 29 was prepared by repeating the procedures of Example 8, except that the i-type layer 104 was formed by repeating the procedures for the formation of the i-type layer in Example 3 wherein a polycrystal SiGe was used in stead of the Si polycrystal and there were not used the H$_2$ gas and the F$_2$ gas, to thereby form an i-type A-SiGe film.

The characteristic properties of each of the two samples as a solar cell were evaluated. The results obtained were as shown in Table 31.

Then, the respective resultant deposited films were examined for the content of hydrogen atoms (H) and the proportion of crystal grain domains per unit volume in accordance with the procedures of examining them which were employed in the foregoing Experiments.

The result obtained were as shown in Table 31.

COMPARATIVE EXAMPLE 5

In this comparative example, there was prepared a triple-cells stacked pin junction photovoltaic comparative sample with the configuration shown in FIG. 1(C)(Sample No. 30) by repeating the procedures of Example 13, except that the p-type semiconductor layer 105-3 was formed by repeating the procedures for the formation of the p-type semiconductor layer of Example 24 to thereby a p-type A-Si:H:F:B film.

The characteristic properties of Sample No. 30 as a solar cell were evaluated. The results obtained were as shown in Table 30.

Observations on the Evaluation Results shown in Tables 26 to 33

In Tables 26 to 33, with respect to characteristic properties required for a pin junction photovoltaic element, there are indicated the following items: (a) open-circuit voltage (Voc) which is generated when the element is irradiated with AM-1.5 light (100 mW/cm$^2$); (b) short-circuit photocurrent [Isc (mA/cm$^2$)] under irradiation of AM-1.5 light; and (c) the relative value of the output which is generated when the element is irradiated with AM-1.5 light through 450 nm interference filter versus the output which is generated when the A-Si pin-junction photovoltaic element as the standard (hereinafter referred to as "A-Si base pin junction photovoltaic element") which was prepared in Comparative Example 1 is irradiated through the interference filter.

In Tables 26 to 33, there are also shown the content of hydrogen atoms (H) and the proportion of crystal grain domains per unit volume in the ZnSe:H:M film, which were measured to see if said film constituting the photovoltaic element meets the requirements for the content of hydrogen atoms (H) and the proportion of crystal grain domains per unit volume specified in the present invention.

The evaluation results indicate the following.

That is, it is understood that any of the pin junction photovoltaic elements prepared in Examples 1 to 4 respectively having an n-type semiconductor layer comprising an n-typed non-single crystal (amorphous) silicon-containing film, an i-type semiconductor layer comprising a non-single crystal (amorphous) silicon-containing film and a p-type semiconductor layer comprising a specific ZnSe:H:Mp film containing the specific amount of hydrogen atoms and having the specific proportion of crystal grain domains per unit volume generates a higher open-circuit voltage, provides a higher short-circuit photocurrent and a higher output than the A-Si base pin junction photovoltaic element.

It is also understood that any of the pin junction photovoltaic elements prepared in Examples 5 to 8, respectively having an n-type semiconductor layer comprising an n-typed non-single crystal (amorphous) silicon and germanium-containing film, an i-type semiconductor layer comprising a non-single crystal (amorphous) silicon and germanium-containing film and a p-type semiconductor layer comprising a specific ZnSe:H:Mp film containing the specific amount of hydrogen atoms and having the specific proportion of crystal grain domains per unit volume, is desirably high in the value of the Voc and also in the value of the Isc, surpassing the A-Si base pin junction photovoltaic element and comparative to those obtained in Examples 1 to 4.

It is further understood that any of the pin junction photovoltaic elements (Sample Nos. 9 to 12) prepared in Example 9, respectively having an n-type semiconductor layer comprising an n-typed non-single crystal (amorphous) silicon-containing film, an i-type semiconductor layer comprising a non-single crystal (amorphous) silicon and carbon-containing film and a p-type semiconductor layer comprising a specific ZnSe:H:Mp film containing the specific amount of hydrogen atoms and having the specific proportion of crystal grain domains per unit volume, is desirably high in the value of the Voc and also in the value of the Isc, surpassing the A-Si base pin junction photovoltaic element and comparative to those obtained in Examples 1 to 4.

In addition, it is understood that any of the pin junction photovoltaic elements (Sample No. 13 to 16) prepared in Example 10, respectively having an n-type semiconductor layer comprising an n-typed non-single crystal (amorphous) silicon containing film, an i-type semiconductor layer comprising a poly-Si:H film and a p-type semiconductor layer comprising a specific ZnSe:H:Mp film containing the specific amount of hydrogen atoms and having the specific proportion of crystal grain domains per unit volume, is desirably high in the value of the Voc and also in the value of the Isc, surpassing the A-Si base pin junction photovoltaic element and comparative to those obtained in Examples 1 to 4.

The pin junction photovoltaic elements (Sample Nos. 17 to 20) prepared in Example 11 are of the configuration shown in FIG. 1(B). the p-type semiconductor layer of which being comprised of a specific ZnSe:H:Mp film containing the specific amount of hydrogen atoms and having the specific proportion of crystal grain domains per unit volume, the i-type semiconductor layer being comprised of A-Si:H:F film (Sample No. 17), A-SiGe:H:F film (Sample No. 18), A-SiC:H:F (Sample No. 19) or poly-Si:H:F (Sample No. 20), and the n-type semiconductor layer being comprised of A-Si:H:F:P (Sample Nos. 17, 19 and 20) or A-SiGe:H:F:P (Sample No. 20). It is understood that any of the said pin junction photovoltaic elements is desirably high in the value of the Voc and also in the value of the Isc, surpassing the A-Si base pin junction photovoltaic element and comparative to those obtained in Examples 1 to 4.

As for the pin junction photovoltaic element (Sample No. 21) having an n-type semiconductor layer comprising a specific ZnSe:H:Mn film, an i-type semiconductor layer comprising a A-Si:H:F film and a p-type semiconductor layer comprising a specific ZnSe:H:Mp film which was obtained in Example 12, it is understood that the element is desirably satisfactory for any of the above evaluation items (a) to (c) and it is surpassing the A-Si base pin junction photovoltaic element.

In Example 13, there was prepared a triple-cells stacked pin junction element (Sample No. 22); the three p-type semiconductor layers being comprised of a specific ZnSe:H:Mp film: the n type semiconductor layer in the first cell unit being comprised of A-SiGe:H:F:P film and the remaining two n-type semiconductor layers being comprised of A-Si:H:F:P film: and the three i-type semiconductors being respectively comprised of A-SiGe:H:F film, A-Si:H:F film and A-SiC:H:F film. And the comparative triple-cells stacked pin junction photovoltaic element (Sample No. 30) prepared in Comparative Example 5 is different from the triple-cells stacked pin junction photovoltaic element of Sample No. 22 with the point that the p-type semiconductor layer in the third cell unit is comprised of A-Si:H:F:B film.

And as for Sample No. 22 (Example 13) and Sample No. 30 (Comparative Example 5), as shown in Table 30, there was examined, in addition to the value of the Voc and the value of the Isc, the change in photoelectric conversion efficiency that takes place after continuous irradiation with AM-1.5 light for 10 hours: the change is expressed by $\Delta\eta/\eta_o$, where $\Delta\eta$ is the amount of change in photoelectric conversion efficiency and $\eta_o$ is the initial photoelectric conversion efficiency.

The results of Table 30 indicate: (1) the element of Sample No. 22 is superior to the element of Sample No. 30 with respect to the Voc and the Isc, (2) for the $\Delta\eta/\eta_o$, its value of the former is smaller than that of the latter and (3) the element of Sample No. 22 excels in the initial characteristics and the repeated usability for a long period of time as a solar cell in the viewpoint that the photoelectric conversion efficiency is suddenly once deteriorated within a short period of time, that is within a period of less than 10 hours upon its use, and the said change thereafter is slow.

In Examples 14 to 17, there were used a specific ZnSe:H:Mp film as the p-type semiconductor layer and a A-Si:H:F film as the i-type semiconductor layer, then as the n-type semiconductor layer, there were used a ZnSe:Ga film (in Example 14), a A-SiGe:H:F:P film (in Example 15), a A-SiC:H:F:P film (in Example 16) and a GaAs:Si film (in Example 17).

As Table 32 illustrates, it is understood that any of the pin junction photovoltaic elements obtained in Examples 14 to 17 is a desired one which is high in the Voc and the Isc.

In Examples 18 to 23, there were used a specific ZnSe:H:Mp film as the p-type semiconductor layer and a specific ZnSe:H:Mn film as the n-type semiconductor layer, then as the i-type semiconductor layer, there were used a A-Si:H film (in Example 18), a A-SiGe:H film (in Example 19), a A-SiC:H film (in Example 20), a A-Si:F film (in Example 21), a A-SiGeC:H film (in Example 22) and a polySi:H film (in Example 23).

As Table 32 illustrates, it is understood that any of the pin junction photovoltaic elements obtained in Examples 18 to 23 is a desired one which is high in the Voc and the Isc.

In Examples 24 to 27, there were used a specific ZnSe:H:Mn film as the n-type semiconductor layer and a A-Si:H:F film as the i-type semiconductor layer, then as the p-type semiconductor layer, there were used a A-Si:H:F:B film (in Example 24), a A-SiC:H:F:B film (in Example 25), a ZnTe:P film (in Example 26) and a GaP:Zn film (in Example 27).

As Table 33 illustrates, it is understood that any of the pin junction photovoltaic elements obtained in Examples 24 to 27 is a desired one which is high in the Voc and the Isc.

In comparative Example 2, there were prepared two pin junction photovoltaic elements. One of them (Sample No. 24) was prepared in the same manner as in Example 1 except that no $H_2$ gas was used at the time of forming the p-type semiconductor layer. The other one (Sample No. 25) was prepared in the same manner as in Example 1 except that the flow rate of the $H_2$ gas to be fed was changed at the time of forming the p-type semiconductor layer. For Sample No. 24, it is understood that the content of hydrogen atoms and the proportion of crystal grain domains per unit volume for the p-type semiconductor layer are all outside the specific ranges according to the present invention, and the pin junction photovoltaic element of Sample No. 24 is inferior to any of the pin junction photovoltaic elements obtained in the examples of the present invention. Likewise, the pin junction photovoltaic element of Sample No. 25 is inferior to any of the pin junction photovoltaic elements obtained in the examples of the present invention.

In comparative Example 3, there were prepared two pin junction photovoltaic elements. One of them (Sample No. 26) was prepared in the same manner as in Example 5 except that no $H_2$ gas was used at the time of forming the p-type semiconductor layer. The other one (Sample No. 27) was prepared in the same manner as in Example 9 except that the $H_2$ gas was not used at the time of forming the p-type semiconductor layer. For Sample No. 26, it is understood that the content of hydrogen atoms and the proportion of crystal grain domains per unit volume for the p-type semiconductor layer are all outside the specific ranges according to the present invention, and the pin junction photovoltaic element of Sample No. 26 is inferior to any of the pin junction photovoltaic elements obtained in the examples of the present invention. Likewise, the pin junction photovoltaic element of Sample No. 27 is inferior to any of the pin junction photovoltaic elements obtained in the examples of the present invention.

The two pin junction photovoltaic elements (Sample Nos. 28 and 29) prepared in Comparative Example 4 are that their i-type semiconductor layer is comprised of a non-single crystal film containing neither hydrogen atoms nor fluorine atoms.

As Table 31 illustrates, it is understood that any of the pin junction photovoltaic elements of Sample Nos. 28 and 29 is inferior to any of the pin junction photovoltaic elements obtained in the examples of the present invention.

TABLE 1

| | |
|---|---|
| substrate temperature | 200° C. |
| raw material gas (A) | DEZn $10 \times 10^{-6}$ mol/min |
| | He 10 sccm |
| raw material gas (B) | DESe $1.5 \times 10^{-5}$ mol/min |
| | He 15 sccm |
| | $H_2$* 1.5 sccm ~ 1 slm |
| inner pressure | 0.5 Torr |
| power of activation energy | 200 W |
| | (microwave of 2.45 GHz) |
| distance between activation chamber and liberation hole for gas from gas feed pipe | 5 cm |

| *flow rate of the $H_2$ gas | |
|---|---|
| Sample No. 1 | 0.1 sccm |
| No. 2 | 0.3 sccm |
| No. 3 | 1 sccm |
| No. 4 | 3 sccm |
| No. 5 | 5 sccm |
| No. 6 | 10 sccm |
| No. 7 | 15 sccm |
| No. 8 | 20 sccm |
| No. 9 | 30 sccm |
| No. 10 | 100 sccm |
| No. 11 | 300 sccm |
| No. 12 | 1 slm |

Note:
DEZn: $(C_2H_4)_2Zn$
DESe: $(C_2H_4)_2Se$

TABLE 2

| | composition (atomic %) | |
|---|---|---|
| Sample No. | Zn | Se |
| 1 | 47 | 52 |
| 2 | 51 | 48 |
| 3 | 48 | 50 |
| 4 | 45 | 53 |
| 5 | 51 | 46 |
| 6 | 51 | 46 |
| 7 | 49 | 48 |
| 8 | 50 | 47 |
| 9 | 48 | 48 |
| 10 | 46 | 50 |
| 11 | 51 | 47 |
| 12 | 49 | 48 |

TABLE 3

| | | semiconductor film (1) (dopant) | | semiconductor film (2) | | semiconductor film (3) (dopant) | | short-circuit photocurrent under irradiation of AM-1.5 light Isc [mA/cm²] | open-circuit voltage under irradiation of AM-1.5 light Voc [volt] | total evaluation |
|---|---|---|---|---|---|---|---|---|---|---|
| Present invention | p-type | ZnSe:H (Li) | i-type | A-Si:H:F | n-type | A-Si:H:F (P) | | ◎ | ◎ | ◎ |
| | p-type | ZnSe:H (Li) | i-type | A-SiGe:H:F | n-type | A-Si:H:F (P) | | ○ | ◎ | ○ |
| | p-type | ZnSe:H (Li) | i-type | A-SiC:H:F | n-type | A-Si:H:F (P) | | ◎ | ○ | ◎ |
| | p-type | ZnSe:H (Li) | i-type | poly-Si:H:F | n-type | A-Si:H:F (P) | | ◎ | ○ | ◎ |
| Comparative example (1) | p-type | ZnSe (Li) | i-type | A-Si:H:F | n-type | A-Si:H:F (P) | | △ | △ | △ |
| | p-type | ZnSe (Li) | i-type | A-SiGe:H:F | n-type | A-Si:H:F (P) | | X | △ | X |
| | p-type | ZnSe (Li) | i-type | A-SiC:H:F | n-type | A-Si:H:F (P) | | △ | △ | △ |
| | p-type | ZnSe (Li) | i-type | poly-Si:H:F | n-type | A-Si:H:F (P) | | △ | △ | △ |
| | p-type | ZnTe (P) | i-type | A-Si:H:F | n-type | A-Si:H:F (P) | | △ | △ | X |

TABLE 3-continued

| | | semiconductor film (1) (dopant) | | semiconductor film (2) | | semiconductor film (3) (dopant) | short-circuit photocurrent under irradiation of AM-1.5 light Isc [mA/cm$^2$] | open-circuit voltage under irradiation of AM-1.5 light Voc [volt] | total evaluation |
|---|---|---|---|---|---|---|---|---|---|
| Comparative example (2) | p-type | CdTe (Li) | i-type | A-Si:H:F | n-type | A-Si:H:F (P) | Δ | Δ | X |
| | p-type | ZnSe:H (Li) | i-type | A-Si | n-type | A-Si:H:F (P) | X | X | X |
| | | | i-type | A-SiGe | n-type | A-Si:H:F (P) | X | Δ | X |
| | | | i-type | A-SiC | n-type | A-Si:H:F (P) | X | X | X |
| | | | i-type | poly-Si | n-type | A-Si:H:F (P) | X | Δ | X |

Note
◎ : excellent
○ : good
Δ: practically acceptable
X: practically not acceptable

TABLE 4

| raw material gas | gas used | flow rate |
|---|---|---|
| (A) | SiF$_4$ | 30 SCCM |
| | Ar | 100 SCCM |
| | PH$_3$ (diluted by H$_2$ gas to 1%) | 0.9 SCCM |
| (B) | H$_2$ | 10 SCCM |
| | Ar | 100 SCCM |

TABLE 5

| raw material gas | gas used | flow rate |
|---|---|---|
| (A) | DEZn | $1.0 \times 10^{-6}$ (mol/min) |
| | Ar | 10 SCCM |
| | LiC$_3$H$_7$ | $1.0 \times 10^{-9}$ (mol/min) |
| (B) | DESe | $1.0 \times 10^{-5}$ (mol/min) |
| | Ar | 15 SCCM |
| | H$_2$ | 15 SCCM |

TABLE 6

| raw material gas | gas used | flow rate n-type | i-type | p-type |
|---|---|---|---|---|
| (A) | SiH$_2$ | 25 SSCM | 50 SCCM | — |
| | PH$_3$ (diluted by H$_2$ gas to 1%) | 5 SCCM | — | — |
| | Ar | — | — | 10 SCCM |
| | LiC$_3$H$_7$ | — | — | $1.5 \times 10^{-9}$ (mol/min) |
| | DEZn | — | — | $1.0 \times 10^{-6}$ (mol/min) |
| (B) | H$_2$ | 30 SCCM | 50 SCCM | 15 SCCM |
| | Ar | — | — | 15 SCCM |
| | DESe | — | — | $1.5 \times 10^{-5}$ (mol/min) |
| discharging power | | 30 W | 20 W | 50 W |

TABLE 7

| gas used | flow rate n-type | i-type | p-type |
|---|---|---|---|
| Ar | 10 SCCM | 10 SCCM | 10 SCCM |
| H$_2$ | 10 SCCM | 10 SCCM | 10 SCCM |
| PH$_3$ (diluted by H$_2$ gas to 1%) | 1 SCCM | — | — |
| LiC$_3$H$_7$ | — | — | $1.5 \times 10^{-9}$ (mol/min) |
| F$_2$ | 0.5 SCCM | 0.5 SCCM | — |

TABLE 8

| semiconductor layer | raw material gas | gas used and its flow rate (SCCM) | inner pressure (Torr) | discharging power (W) | substrate temperature (°C.) | film formation period (minute) |
|---|---|---|---|---|---|---|
| n-type layer | A | SiF$_4$ 25 GeF$_4$ 0.5 PH$_3$ (diluted by H$_2$ gas to 1%) 10 | 0.2 | 250 | 200 | 2 |
| | B | H$_2$ 100 Ar 250 | | | | |
| i-type layer | A | SiF$_4$ 20 GeF$_4$ 0.5 | 0.2 | 200 | 200 | 50 |
| | B | H$_2$ 10 Ar 250 | | | | |

TABLE 9

| semiconductor layer | gas used and its flow rate (SCCM) | inner pressure (Torr) | discharging power (W) | substrate temperature (°C.) | film formation period (minute) |
|---|---|---|---|---|---|
| n-type layer | SiH$_2$F$_2$ 25 GeH$_4$ 2 PH$_3$ (diluted by H$_2$ gas to 1%) 5 | 0.5 | 20 | 200 | 3 |
| i-type | SiH$_2$F$_2$ 50 | 0.5 | 15 | 200 | 60 |

TABLE 9-continued

| semi-conductor layer | gas used and its flow rate (SCCM) | inner pressure (Torr) | discharging power (W) | substrate temperature (°C.) | film formation period (minute) |
|---|---|---|---|---|---|
| layer | $GeH_4$ 5 | | | | |

TABLE 10

| preparation method | gas used and its flow rate (SCCM) | inner pressure (Torr) | discharging power (W) | substrate temperature (°C.) | film formation period (minute) |
|---|---|---|---|---|---|
| (1) | $SiF_4$ 50<br>$CH_4$ 20<br>Ar 250<br>$H_2$ 40 | 0.2 | 200<br>(microwave of 2.45 GHz) | 200 | 50 |
| (2) | $SiH_2F_2$ 50<br>$CH_4$ 5 | 0.5 | 10<br>(13.56 MHz) | 200 | 40 |
| (3) | Target material: polycrystal SiC<br>Ar 50<br>$F_2$ 1<br>$H_2$ 20 | 0.04 | 500<br>(13.56 MHz) | 200 | 30 |

TABLE 11

| preparation method | gas used and its flow rate (SCCM) | inner pressure (Torr) | discharging power (W) | substrate temperature (°C.) | film formation period (minute) |
|---|---|---|---|---|---|
| (1) | $SiF_4$ 50<br>Ar 250<br>$H_2$ 100 | 0.2 | 300<br>(microwave of 2.45 GHz) | 200 | 90 |
| (2) | $SiH_4$ 50<br>(diluted by $H_2$ gas to 1%) | 0.5 | 60<br>(13.56 MHz) | 200 | 110 |
| (3) | Target material: polycrystal Si<br>Ar 50<br>$H_2$ 50 | 0.04 | 600<br>(13.56 MHz) | 200 | 30 |

TABLE 12

| Sample No. | i/n-type semiconductor layer | preparation method |
|---|---|---|
| 17 | A-Si:H/A-Si:H:F:P | the same film-forming conditions as in Example 1 |
| 18 | A-SiGe:H/A-SiGe:H:F:P | the same film-forming conditions as in Example 5 |
| 19 | A-SiC:H/A-Si:H:F:P | the same film-forming conditions for Sample No.9 in Example 9 |
| 20 | poly-Si:H:F/A-Si:H:F:P | the same film-forming conditions for Sample No. 13 in Example 10 |

TABLE 13

| raw material gas | gas used | flow rate |
|---|---|---|
| (A) | DEZn | $1.2 \times 10^{-6}$ mol/min |
| | Ar | 10 SCCM |
| | TEAl | $3.0 \times 10^{-9}$ mol/min |
| (B) | DESe | $1.8 \times 10^{-5}$ mol/min |
| | Ar | 15 SCCM |
| | $H_2$ | 30 SCCM |

TABLE 14

Conditions for the preparation of n-type ZnSe:Ga film

| | |
|---|---|
| target material | polycrystal ZnSe |
| substrate temperature | 200° C. |
| flow rate of Ar gas | 50 sccm |
| flow rate of Ar gas to bubble Ga(CH$_3$) | 2 sccm |
| inner pressure | 0.05 Torr |
| high frequency power | 320 W (13.56 MHz) |

TABLE 15

Conditions for the preparation of n-type A-SiGe:H:F:P film

| | |
|---|---|
| substrate temperature | 200° C. |
| flow rate of $Si_2H_6$ gas | 7 sccm |
| flow rate of $GeF_4$ gas | 4 sccm |
| flow rate of $PH_3$ gas (diluted by $H_2$ gas to 3000 ppm) | 5 sccm |
| flow rate of $H_2$ gas | 250 sccm |
| inner pressure | 1.2 Torr |
| high frequency power | 40 W (13.56 MHz) |

TABLE 16

Conditions for the preparation of n-type A-SiC:H:F:P film

| | |
|---|---|
| substrate temperature | 200° C. |
| flow rate of $SiF_4$ gas | 30 sccm |
| flow rate of $CH_4$ gas | 5 sccm |
| flow rate of $H_2$ gas | 250 sccm |
| flow rate of $PH_3$ gas (diluted by $H_2$ gas to 3000 ppm) | 20 sccm |
| inner pressure | 1.0 Torr |
| high frequency power | 50 W (13.56 MHz) |

TABLE 17

Conditions for the preparation of n-type GaAs:Si film

| | |
|---|---|
| target material | polycrystal GaAs |

TABLE 17-continued

Conditions for the preparation of n-type GaAs:Si film

| | |
|---|---|
| substrate temperature | 200° C. |
| flow rate of Ar gas | 60 sccm |
| flow rate of SiH$_4$ gas (diluted by Ar gas to 1000 ppm) | 10 sccm |
| inner pressure | 0.05 Torr |
| high frequency power | 350 W (13.56 MHz) |

TABLE 18

Conditions for the preparation of i-type A-Si:H film

| | |
|---|---|
| substrate temperature | 200° C. |
| flow rate of Si$_2$H$_6$ gas | 15 sccm |
| flow rate of H$_2$ gas | 300 sccm |
| inner pressure | 1.5 Torr |
| high frequency power | 35 W (13.56 MHz) |

TABLE 19

Conditions for the preparation of i-type A-SiGe:H film

| | |
|---|---|
| substrate temperature | 200° C. |
| flow rate of Si$_2$H$_6$ gas | 10 sccm |
| flow rate of H$_2$ gas | 250 sccm |
| inner pressure | 1.2 Torr |
| high frequency power | 30 W (13.56 MHz) |

TABLE 20

Conditions for the preparation of i-type A-SiC:H film

| | |
|---|---|
| substrate temperature | 200° C. |
| flow rate of SiH$_4$ gas | 100 sccm |
| flow rate of CH$_4$ gas | 10 sccm |
| flow rate of H$_2$ gas | 300 sccm |
| inner pressure | 0.8 Torr |
| high frequency power | 80 W (13.56 MHz) |

TABLE 21

Conditions for the preparation of i-type A-Si:F film

| | |
|---|---|
| target material | Single-crystal Si |
| substrate temperature | 200° C. |
| flow rate of Ar gas | 80 sccm |
| flow rate of F$_2$ gas | 5 sccm |
| inner pressure | 0.04 Torr |

TABLE 21-continued

Conditions for the preparation of i-type A-Si:F film

| | |
|---|---|
| high frequency power | 400 W (13.56 MHz) |

TABLE 22

Conditions for the preparation of i-type A-SiGe:C:H film

| | |
|---|---|
| substrate temperature | 200° C. |
| flow rate of SiH$_4$ gas | 50 sccm |
| flow rate of GeH$_4$ gas | 25 sccm |
| flow rate of CH$_4$ gas | 2 sccm |
| flow rate of H$_2$ gas | 250 sccm |
| inner pressure | 0.8 Torr |
| high frequency power | 50 W (13.56 MHz) |

TABLE 23

Conditions for the preparation of i-type poly-Si:H film

| | |
|---|---|
| target material | Single-crystal Si |
| substrate temperature | 200° C. |
| flow rate of Ar gas | 25 sccm |
| flow rate of H$_2$ gas | 40 sccm |
| inner pressure | 0.04 Torr |
| high frequency power | 450 W (13.56 MHz) |

TABLE 24

Conditions for the preparation of p-type ZnTe:P film

| | |
|---|---|
| target material | polycrystal ZnTe |
| substrate temperature | 200° C. |
| flow rate of Ar gas | 60 sccm |
| flow rate of PH$_3$ gas (diluted by Ar gas to 2000 ppm) | 10 sccm |
| inner pressure | 0.05 Torr |
| high frequency power | 350 W (13.56 MHz) |

TABLE 25

Conditions for the preparation of p-type GaP:Zn film

| | |
|---|---|
| target material | polycrystal GaP |
| substrate temperature | 200° C. |
| flow rate of Ar gas | 60 sccm |
| flow rate of Ar gas to bubble Zn(CH$_3$)$_3$ | 3 sccm |
| inner pressure | 0.04 Torr |
| high frequency power | 350 W (13.56 MHz) |

TABLE 26

| | | characteristics | | | | |
|---|---|---|---|---|---|---|
| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
| 1 | n-type A-Si:H:F:P | — | — | 0.96 | 17.3 | 1.7 |
| | i-type A-Si:H:F | — | — | | | |
| | p-type A-Si:H:Li | 2.2 | 73 | | | |
| 2 | n-type A-Si:H:F:P | — | — | 0.94 | 17.1 | 1.5 |
| | i-type A-Si:H:F | — | — | | | |
| | p-type ZnSe:H:Li | 2.8 | 69 | | | |
| 3 | n-type A-Si:H:F:P | — | — | 0.91 | 16.5 | 1.3 |
| | i-type A-Si:H:F | — | — | | | |
| | p-type ZnSe:H:Li | 2.6 | 72 | | | |
| 4 | n-type A-Si:H:F:P | — | — | 0.94 | 17.2 | 1.6 |
| | i-type A-Si:H:F | — | — | | | |
| | p-type ZnSe:H:Li | 2.2 | 73 | | | |
| 5 | n-type A-SiGe:H:F:P | — | — | 0.61 | 19.6 | 1.2 |
| | i-type A-SiGe:H:F | — | — | | | |
| | p-type ZnSe:H:Li | 2.2 | 73 | | | |
| 6 | n-type A-SiGe:H:F:P | — | — | 0.56 | 18.0 | 1.1 |
| | i-type A-SiGe:H:F | — | — | | | |
| | p-type ZnSe:H:Li | 2.8 | 69 | | | |

TABLE 26-continued

| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|
| 7 | n-type A-SiGe:H:F:P | — | — | 0.50 | 17.3 | 1.0 |
|   | i-type A-SiGe:H:F | — | — | | | |
|   | p-type ZnSe:H:Li | 2.6 | 72 | | | |
| 8 | n-type A-SiGe:H:F:P | — | — | 0.52 | 18.0 | 1.1 |
|   | i-type A-SiGe:H:F | — | — | | | |
|   | p-type ZnSe:H:Li | 2.2 | 73 | | | |

TABLE 27

| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|
| 9 | n-type A-Si:H:F | — | — | 1.05 | 12.0 | 1.3 |
|   | i-type A-SiC:H:F | — | — | | | |
|   | p-type ZnSe:H | 2.2 | 73 | | | |
| 10 | n-type A-Si:H:F | — | — | 1.0 | 11.3 | 1.2 |
|   | i-type A-SiC:H:F | — | — | | | |
|   | p-type ZnSe:H | 2.8 | 69 | | | |
| 11 | n-type A-Si:H:F | — | — | 0.98 | 11.2 | 1.2 |
|   | i-type A-SiC:H:F | — | — | | | |
|   | p-type ZnSe:H | 2.6 | 72 | | | |
| 12 | n-type A-Si:H:F | — | — | 1.0 | 11.5 | 1.25 |
|   | i-type A-SiC:H:F | — | — | | | |
|   | p-type ZnSe:H | 2.2 | 73 | | | |

TABLE 28

| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|
| 13 | n-type A-Si:H:F | — | — | 0.65 | 20.1 | 1.2 |
|   | i-type poly-Si:H:F | — | — | | | |
|   | p-type ZnSe:H | 2.2 | 73 | | | |
| 14 | n-type A-Si:H:F | — | — | 0.62 | 19.5 | 1.2 |
|   | i-type poly-Si:H | — | — | | | |
|   | p-type ZnSe:H | 2.8 | 69 | | | |
| 15 | n-type A-Si:H:F | — | — | 0.56 | 18.3 | 1.1 |
|   | i-type poly-Si:H | — | — | | | |
|   | p-type ZnSe:H | 2.6 | 72 | | | |
| 16 | n-type A-Si:H:F | — | — | 0.62 | 19.8 | 1.2 |
|   | i-type poly-Si:H | — | — | | | |
|   | p-type ZnSe:H | 2.2 | 73 | | | |

TABLE 29

| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|
| 17 | p-type ZnSe:H | 2.2 | 73 | 0.94 | 16.5 | 1.6 |
|   | i-type A-Si:H:F | — | — | | | |
|   | n-type A-Si:H:F | — | — | | | |
| 18 | p-type ZnSe:H | 2.2 | 73 | 0.58 | 18.9 | 1.2 |
|   | i-type A-SiGe:H:F | — | — | | | |
|   | n-type A-SiGe:H:F | — | — | | | |
| 19 | p-type ZnSe:H | 2.2 | 73 | 0.98 | 11.0 | 1.1 |
|   | i-type A-SiC:H:F | — | — | | | |
|   | n-type A-Si:H:F | — | — | | | |

TABLE 29-continued

| | | characteristics | | | | |
|---|---|---|---|---|---|---|
| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
| 20 | p-type ZnSe:H | 2.2 | 73 | 0.58 | 19.5 | 1.1 |
|  | i-type poly-Si:H:F | — | — | | | |
|  | n-type A-Si:H:F | — | — | | | |
| 21 | n-type ZnSe:H | 2.2 | 73 | 0.94 | 16.5 | 1.5 |
|  | i-type A-Si:H:F | — | — | | | |
|  | p-type ZnSe:H | 2.2 | 73 | | | |

TABLE 30

| Sample No. | semiconductor layer | open-circuit voltage under irradiation of AM-1.5 light Voc [volt] | short-circuit photocurrent under irradiation of AM-1.5 light Isc [mA/cm$^2$] | rate of change in conversion efficiency after irradiation of AM-1.5 light for 10 hours [$\Delta\eta/\eta_0\%$] |
|---|---|---|---|---|
| 22 | n-type A-SiGe:H:F | 2.71 | 7.4 | 2.1 |
|  | i-type A-SiGe:H:F | | | |
|  | p-type ZnSe:H | | | |
|  | n-type A-Si:H:F | | | |
|  | i-type A-Si:H:F | | | |
|  | p-type ZnSe:H | | | |
|  | n-type A-Si:H:F | | | |
|  | i-type A-SiC:H:F | | | |
|  | p-type ZnSe:H | | | |
| 30 | n-type A-SiGe:H:F | 2.4 | 6.7 | 3.2 |
|  | i-type A-SiGe:H:F | | | |
|  | p-type ZnSe:H | | | |
|  | n-type A-Si:H:F | | | |
|  | i-type A-Si:H:F | | | |
|  | p-type ZnSe:H | | | |
|  | n-type A-Si:H:F | | | |
|  | i-type A-SiC:H:F | | | |
|  | p-type A-Si:H:F | | | |

TABLE 31

| | | characteristics | | | | |
|---|---|---|---|---|---|---|
| Sample No. | semiconductor layer | hydrogen (H) content in ZnSe film [atomic %] | volume percentage of crystal grain in ZnSe film [%] | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
| 23 | n-type A-Si:H:F | — | — | 0.75 | 14.0 | 1 |
|  | i-type A-Si:H:F | — | — | | | |
|  | p-type A-Si:H:F | — | — | | | |
| 24 | n-type A-Si:H:F | — | — | 0.37 | 6.0 | 0.1 |
|  | i-type A-Si:H:F | — | — | | | |
|  | p-type ZnSe | <0.1 | 89 | | | |
| 25 | n-type A-Si:H:F | — | — | 0.59 | 9.5 | 0.5 |
|  | i-type A-Si:H:F | — | — | | | |
|  | p-type ZnSe:H | 22 | 28 | | | |
| 26 | n-type A-SiGe:H:F | — | — | 0.06 | 1.7 | 0.02 |
|  | i-type A-SiGe:H:F | — | — | | | |
|  | p-type ZnSe | <0.1 | 89 | | | |
| 27 | n-type A-Si:H:F | — | — | 0.05 | 1.0 | 0.01 |
|  | i-type A-SiC:H:F | — | — | | | |
|  | p-type ZnSe | <0.1 | 89 | | | |
| 28 | n-type A-Si:H:F | — | — | 0.04 | 1.5 | 0.2 |
|  | i-type A-Si | — | — | | | |
|  | p-type ZnSe:H | 2.8 | 69 | | | |
| 29 | n-type A-Si:H:F | — | — | 0.02 | 2.0 | 0.3 |
|  | i-type A-SiGe | — | — | | | |
|  | p-type ZnSe:H | 2.2 | 73 | | | |

TABLE 32

| Example No. | semiconductor layer* | characteristics of p-type ZnSe:H film | | open-circuit voltage under irradiation of AM-1.5 light Voc [volt] | short-circuit photocurrent under irradiation of AM-1.5 light Isc [mA/cm²] | output value under irradiation of AM-1.5 light (using 450 nm interference filter) [relative value] |
|---|---|---|---|---|---|---|
| | | content of hydrogen atoms [atomic %] | volume percentage of crystal grain [%] | | | |
| 14 | p-type ZnSe:H(1) | 2.2 | 74 | 0.91 | 17.7 | 1.7 |
| | i-type A-Si:H:F | | | | | |
| | n-type ZnSe | | | | | |
| 15 | p-type ZnSe:H(1) | 2.3 | 74 | 0.92 | 17.5 | 1.6 |
| | i-type A-Si:H:F | | | | | |
| | n-type A-SiGe:H:F | | | | | |
| 16 | p-type ZnSe:H(1) | 2.2 | 75 | 0.97 | 18.0 | 1.8 |
| | i-type A-Si:H:F | | | | | |
| | n-type A-SiC:H:F | | | | | |
| 17 | p-type ZnSe:H(1) | 2.3 | 75 | 0.95 | 17.6 | 1.6 |
| | i-type A-Si:H:F | | | | | |
| | n-type GaAs | | | | | |
| 18 | p-type ZnSe:H(1) | 2.1 | 74 | 0.93 | 17.6 | 1.7 |
| | i-type A-Si:H | | | | | |
| | n-type ZnSe:H(1) | 2.2 | 75 | | | |
| 19 | p-type ZnSe:H(1) | 2.3 | 75 | 0.58 | 19.9 | 1.2 |
| | i-type A-SiGe:H | | | | | |
| | n-type ZnSe:H(1) | 2.3 | 74 | | | |
| 20 | p-type ZnSe:H(1) | 2.2 | 75 | 1.10 | 12.1 | 1.3 |
| | i-type A-SiC:H | | | | | |
| | n-type ZnSe:H(1) | 2.1 | 74 | | | |
| 21 | p-type ZnSe:H(1) | 2.3 | 74 | 0.92 | 17.6 | 1.8 |
| | i-type A-Si:F | | | | | |
| | n-type ZnSe:H(1) | 2.2 | 74 | | | |
| 22 | p-type ZnSe:H(1) | 2.3 | 75 | 0.56 | 19.6 | 1.1 |
| | i-type A-SiGeC:H | | | | | |
| | n-type ZnSe:H(1) | 2.2 | 74 | | | |
| 23 | p-type ZnSe:H(1) | 2.3 | 75 | 0.52 | 18.3 | 1.1 |
| | i-type poly-Si:H | | | | | |
| | n-type ZnSe:H(1) | 2.3 | 74 | | | |

Note*: the numeral mentioned in the parenthesis indicates the corresponding preparation method.

TABLE 33

| Example No. | semiconductor layer* | characteristics of p-type ZnSe:H film | | open-circuit voltage under irradiation of AM-1.5 light Voc [volt] | short-circuit photocurrent under irradiation of AM-1.5 light Isc [mA/cm²] | output value under irradiation of AM-1.5 light (using 450 nm interference filter) [relative value] |
|---|---|---|---|---|---|---|
| | | content of hydrogen atoms [atomic %] | volume percentage of crystal grain [%] | | | |
| 24 | p-type A-Si:H:F | 2.7 | 75 | 0.75 | 14.2 | 1.2 |
| | i-type A-Si:H:F | | | | | |
| | n-type ZnSe:H(1) | | | | | |
| 25 | p-type A-SiC:H:F | 2.7 | 77 | 0.94 | 17.0 | 1.3 |
| | i-type A-Si:H:F | | | | | |
| | n-type ZnSe:H(1) | | | | | |
| 26 | p-type ZnTe | 2.6 | 77 | 0.96 | 17.5 | 1.5 |
| | i-type A-Si:H:F | | | | | |
| | n-type ZnSe:H(1) | | | | | |
| 27 | p-type GaP | 2.7 | 76 | 0.95 | 17.3 | 1.4 |
| | i-type A-Si:H:F | | | | | |
| | n-type ZnSe:H(1) | | | | | |

Note*: the numeral mentioned in the parenthesis indicates the corresponding preparation method.

What is claimed is:

1. An improved pin junction photvoltaic element comprising, in sequence, a p-type semiconductor layer, an i-type semiconductor layer and an n-type semiconductor layer characterized in that at least one of said p-type semiconductor layer and said n-type semiconductor layer is formed of a non-single crystal p-type or n-type semiconductor film comprising (a) zinc atoms and selenium atoms in a stoichiometric composition ratio of about 1:1; (b) hydrogen atoms in an amount of 1 to 4 atomic %; (c) crystal grain domains in a proportion of 65 to 85 volume percent per unit volume; and (d) atoms of a dopant capable of imparting p-type or n-type conductivity, and wherein said i-type semiconductor layer is a non-single crystal film containing silicon atoms as the matrix and at least one kind of atoms selected form the group consisting of hydrogen atoms and fluorine atoms.

2. The pin junction photovoltaic element according to claim 1, wherein said atoms of a dopant capable of imparting p-type conductivity are atoms of an element selected from the group consisting of Group IA elements and Group VA elements of the Periodic Table.

3. The pin junction photovoltaic element according to claim 2, wherein said atoms of a dopant capable of imparting p-type conductivity are lithium atoms.

4. The pin junction photovoltaic element according to claim 1, wherein the amount of the atoms of a dopant capable of imparting p-type conductivity is in the range from 50 to $1\times10^4$ atomic ppm.

5. The pin junction photovoltaic element according to claim I, wherein said atoms of a dopant capable of imparting n-type conductivity are atoms of an element selected from the group consisting of Group IIIB elements and Group IVB elements of the Periodic Table.

6. The pin junction photovoltaic element according to claim 5, wherein said atoms of a dopant capable of imparting n-type conductivity are selected from the group consisting of aluminum or gallium atoms.

7. The pin junction photovoltaic element according to claim 5, wherein the amount of the atoms of a dopant capable of imparting n-type conductivity is in the range from 50 to $1\times10^4$ atomic ppm.

8. The pin junction photovoltaic element according to claim 1, wherein said non-single crystal film constituting the i-type semiconductor layer further contains at least one kind of atoms selected from the group consisting of carbon atoms or germanium atoms.

9. An improved pin junction photovoltaic element comprising, in sequence, a p-type semiconductor layer, an i-type semiconductor layer and an n-type semiconductor layer characterized in that said p-type semiconductor layer is formed characterized in that said p-type semiconductor layer is formed of a p-type non-single crystal semiconductor film comprising (a) zinc atoms and selenium atoms in a stoichiometric composition ratio of about 1:1; (b) hydrogen atoms in an amount of 1 to 4 atomic %; (c) crystal grain domains in a proportion of 65 to 85 volume percent per ;unit volume; and (d) atoms of an element (m) selected form the group consisting of Group IA and Group VA elements of the Periodic Table in an amount of 50 to $1\times10^4$ atomic ppm; said i-type semiconductor layer being formed of a non-doped non-single film selected from the group consisting of (i) a non-single crystal film containing silicon atoms as the matrix and at least one kind of atoms selected from the group consisting of hydrogen atoms and fluorine atoms and (ii) a non-single crystal film containing silicon atoms, at least one kind of atoms selected from the group consisting of carbon atoms and germanium atoms and at least one kind of atoms selected from the group consisting of hydrogen atoms and fluorine atoms; and wherein said n-type semiconductor layer is an n-type non-single crystal semiconductor film comprising (e) zinc atoms and selenium atoms in a stoichiometic composition ratio of about 1:1; (f) hydrogen atoms in an amount of 1 to 4 atomic %; (g) crystal grain domains in a proportion of 65 to 85 volume percent unit per unit volume; and (h) atoms of an element (n) selected from the group consisting of Group IIIB elements and Group IvB elements of the Periodic Table in an amount of 50 to $1\times10^4$ atomic ppm.

10. The pin junction photovoltaic element according to claim 9, wherein said element (m) is lithium and said element (n) is aluminum or gallium.

* * * * *

UNITED STATES PATENT AND TRADEMARK OFFICE
CERTIFICATE OF CORRECTION

PATENT NO. : 4,926,229

DATED : May 15, 1990

INVENTOR(S) : KATSUMI NAKAGAWA, ET AL.

It is certified that error appears in the above-identified patent and that said Letters Patent is hereby corrected as shown below:

ON THE TITLE PAGE,

IN [54] TITLE

"P OR N-TYPE" should read --P- OR N-TYPE--.

IN [57] ABSTRACT

Line 7, "typed or n-typed" should read
--type or n-type--.

COLUMN 1

Line 2, "P OR N-TYPE" should read --P- OR N-TYPE--.

COLUMN 3

Line 49, "ZnTe crystal" should read --ZnTe compound, $ZnSe_{1-x}Te_x$ compound, ZnSe crystal grains, ZnTe crystal--.

COLUMN 6

Line 24, "thereinto" should read --thereinto.--.

COLUMN 8

Line 65, "film" should read --film.--.

COLUMN 9

Line 65, "domans" should read --domains--.

UNITED STATES PATENT AND TRADEMARK OFFICE
CERTIFICATE OF CORRECTION

PATENT NO. : 4,926,229
DATED : May 15, 1990
INVENTOR(S) : KATSUMI NAKAGAWA, ET AL.

It is certified that error appears in the above-identified patent and that said Letters Patent is hereby corrected as shown below:

COLUMN 10

Line 63, "proportion more." should read --proportion of the crystal grain domains per unit volume be 65 vol % or more--.

COLUMN 11

Line 22, "n-type)" should read --n-type).--.
    Line 26, "mol/min in stead" should read --mol/min. instead--.

COLUMN 12

Line 10, "form" should read --from--.

COLUMN 13

Line 20, "semiconductorllayer" should read --semiconductor layer--.

COLUMN 14

Line 4, "ZnS series" should read --ZnSe series--.

COLUMN 15

Line 6, "incomensurateness," should read --incommensurateness,--.

UNITED STATES PATENT AND TRADEMARK OFFICE
CERTIFICATE OF CORRECTION

PATENT NO. : 4,926,229

DATED : May 15, 1990

INVENTOR(S) : KATSUMI NAKAGAWA, ET AL.

It is certified that error appears in the above-identified patent and that said Letters Patent is hereby corrected as shown below:

COLUMN 21

Line 66, "The" should read --the--.

COLUMN 22

Line 19, "and a into" should read --into--.

COLUMN 26

Line 43, "energty" should read --energy--.

COLUMN 27

Line 31, "p-typed or n-typed films" should read --p-type or n-type films--.
Line 59, "in stead" should read --instead--.

COLUMN 28

Line 11, "in stead" should read --instead--.
Line 34, "in stead" should read --instead--.
Line 64, "$C_2H_2,C_2H_6$" should read --$C_2H_2$, $C_2H_6$--.

COLUMN 30

Line 59, "target" should read --target.--.

UNITED STATES PATENT AND TRADEMARK OFFICE
CERTIFICATE OF CORRECTION

PATENT NO. : 4,926,229
DATED : May 15, 1990
INVENTOR(S) : KATSUMI NAKAGAWA, ET AL.

It is certified that error appears in the above-identified patent and that said Letters Patent is hereby corrected as shown below:

COLUMN 32

Line 33, "the amount" should read --the inlet pipe 209 into the film-forming chamber 201. The amount--.

COLUMN 40

Line 21, "the" should be deleted.
    Line 68, "the" (second occurrence) should be deleted.

COLUMN 41

Line 16, "the" should be deleted.

COLUMN 45

Line 52, "the except" should read --the formation of the n-type semiconductor layer in Example 1, except--.
    Line 54, "in stead" should read --instead--.

COLUMN 46

Line 67, "repating" should read --repeating--.

COLUMN 48

Line 3, "prepare" should read --prepared--.
    Line 16, "in stead" should read --instead--.

UNITED STATES PATENT AND TRADEMARK OFFICE
CERTIFICATE OF CORRECTION

PATENT NO. : 4,926,229

DATED : May 15, 1990

INVENTOR(S) : KATSUMI NAKAGAWA, ET AL.

It is certified that error appears in the above-identified patent and that said Letters Patent is hereby corrected as shown below:

COLUMN 49

Line 15, "n-typed" should read --n-type--.
Line 44, "n-typed" should read --n-type--.
Line 57, "FIG. 1(B)." should read --FIG. 1(B),--.

COLUMN 52

TABLE 3, "⊙ ○ ◉" should read --⊙ ◎ ◎--.

COLUMN 53

TABLE 6, "$SiH_2$" should read --$SiH_2F_2$--.

COLUMN 57

TABLE 19, "flow rate of $Si_2H_6$ gas     10 sccm
           flow rate of $H_2$ gas       250 sccm"

should read --flow rate of $SiH_6$ gas     10 sccm
             flow rate of $GeH_4$ gas     4 sccm
             flow rate of $H_2$ gas       250 sccm--.

TABLE 26, "p-type A-Si:H:Li" should read
--p-type ZNSe:H:Li--.

COLUMN 64

Line 57, "form" should read --from--.

UNITED STATES PATENT AND TRADEMARK OFFICE
CERTIFICATE OF CORRECTION

PATENT NO. : 4,926,229
DATED : May 15, 1990
INVENTOR(S) : KATSUMI NAKAGAWA, ET AL.

It is certified that error appears in the above-identified patent and that said Letters Patent is hereby corrected as shown below:

COLUMN 65

Line 4, "claim I," should read --claim 1,--.
Line 25, "characterized in that said p-type" should be deleted.
Line 26, "semiconductor layer is formed" should be deleted.

COLUMN 66

Line 2, "per ;unit volume;" should read --per unit volume;--.
Line 21, "unit" should be deleted.
Line 24, "Group IvB" should read --Group IVB--.

Signed and Sealed this

Ninth Day of June, 1992

Attest:

DOUGLAS B. COMER

Attesting Officer

Acting Commissioner of Patents and Trademarks